United States Patent
Fukui et al.

(10) Patent No.: US 11,271,084 B2
(45) Date of Patent: Mar. 8, 2022

(54) SEMICONDUCTOR DEVICE AND POWER CONVERTER

(71) Applicant: Mitsubishi Electric Corporation, Tokyo (JP)

(72) Inventors: Yutaka Fukui, Tokyo (JP); Katsutoshi Sugawara, Tokyo (JP); Hideyuki Hatta, Tokyo (JP); Hidenori Koketsu, Tokyo (JP); Rina Tanaka, Tokyo (JP); Yusuke Miyata, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 171 days.

(21) Appl. No.: 16/605,216

(22) PCT Filed: May 30, 2018

(86) PCT No.: PCT/JP2018/020723
§ 371 (c)(1),
(2) Date: Oct. 15, 2019

(87) PCT Pub. No.: WO2018/225600
PCT Pub. Date: Dec. 13, 2018

(65) Prior Publication Data
US 2021/0288156 A1    Sep. 16, 2021

(30) Foreign Application Priority Data
Jun. 6, 2017 (JP) .............................. JP2017-111336

(51) Int. Cl.
*H01L 29/16* (2006.01)
*H01L 29/66* (2006.01)
(Continued)

(52) U.S. Cl.
CPC ...... *H01L 29/4236* (2013.01); *H01L 29/1095* (2013.01); *H01L 29/1608* (2013.01); *H01L 29/7813* (2013.01)

(58) Field of Classification Search
CPC . H01L 29/16; H01L 29/1608; H01L 29/1095; H01L 29/42; H01L 29/423;
(Continued)

(56) References Cited

U.S. PATENT DOCUMENTS

| 9,293,558 B2 | 3/2016 | Siemieniec et al. |
| 2003/0201456 A1 | 10/2003 | Saitoh et al. |

(Continued)

FOREIGN PATENT DOCUMENTS

| JP | 2004-6598 A | 1/2004 |
| JP | 2004-134597 A | 4/2004 |

(Continued)

OTHER PUBLICATIONS

International Search Report and Written Opinion dated Jul. 24, 2018 for PCT/JP2018/020723 filed on May 30, 2018, 12 pages including English Translation of the International Search Report.

(Continued)

*Primary Examiner* — Fazli Erdem
(74) *Attorney, Agent, or Firm* — Xsensus LLP

(57) ABSTRACT

The present invention relates to a semiconductor device having trench gates. The semiconductor device includes the following: a first semiconductor layer; a first semiconductor region selectively disposed in the upper layer of the first semiconductor layer; a second semiconductor region in contact with the first semiconductor region; a third semiconductor region on the bottom surfaces of the first and second semiconductor regions; gate trenches provided to penetrate the first and third semiconductor regions in the thickness direction of the first and third semiconductor (Continued)

regions to reach the inside of the first semiconductor layer; a field-reducing region on the bottom of each gate trench; and connection layers arranged in the first semiconductor layer at intervals so as to be each in contact with at least one of sidewalls of the gate trenches, the connection layers each electrically connecting the field-reducing region to the third semiconductor region.

19 Claims, 31 Drawing Sheets

(51) Int. Cl.
*H01L 29/78* (2006.01)
*H01L 29/423* (2006.01)
*H01L 29/10* (2006.01)

(58) Field of Classification Search
CPC . H01L 29/4236; H01L 29/78; H01L 29/7813; H01L 29/08; H01L 29/417; H01L 29/73; H01L 29/7393; H01L 29/872
USPC .......................................................... 257/330
See application file for complete search history.

(56) References Cited

U.S. PATENT DOCUMENTS

| | | |
|---|---|---|
| 2004/0135228 A1 | 7/2004 | Iwamoto et al. |
| 2004/0195618 A1 | 10/2004 | Saito et al. |
| 2006/0076617 A1 | 4/2006 | Shenoy et al. |
| 2009/0280609 A1 | 11/2009 | Akiba et al. |
| 2009/0311839 A1 | 12/2009 | Miyahara et al. |
| 2011/0233728 A1 | 9/2011 | Chiola et al. |
| 2011/0291110 A1 | 12/2011 | Suzuki et al. |
| 2013/0001592 A1 | 1/2013 | Miyahara et al. |
| 2013/0306983 A1 | 11/2013 | Nakano et al. |
| 2013/0341711 A1 | 12/2013 | Matsumoto et al. |
| 2015/0357415 A1* | 12/2015 | Kagawa ............... H01L 29/0623 257/77 |
| 2016/0247910 A1 | 8/2016 | Suzuki et al. |
| 2019/0348524 A1* | 11/2019 | Ebiike ................. H01L 29/1095 |

FOREIGN PATENT DOCUMENTS

| | | |
|---|---|---|
| JP | 2004-311716 A | 11/2004 |
| JP | 2008-516451 A | 5/2008 |
| JP | 2009-259896 A | 11/2009 |
| JP | 2009-302436 A | 12/2009 |
| JP | 2011-253837 A | 12/2011 |
| JP | 2012-178536 A | 9/2012 |
| JP | 2013-012590 A | 1/2013 |
| JP | 2013-243207 A | 12/2013 |
| JP | 2014-3191 A | 1/2014 |
| JP | 2015-072999 A | 4/2015 |
| JP | 5907940 B2 | 4/2016 |
| JP | 2016-115847 A | 6/2016 |
| JP | 2016-134568 A | 7/2016 |
| JP | 2017-050516 A | 3/2017 |
| WO | 2014/122919 A1 | 8/2014 |

OTHER PUBLICATIONS

Notification of Reasons for Refusal received for Japanese Patent Application No. 2018-557070, dated Jan. 15, 2019, 14 pages including English Translation.
Decision of Refusal received for Japanese Patent Application No. 2018-557070, dated Apr. 9, 2019, 10 pages including English Translation.
Office Action dated Dec. 15, 2020, in corresponding Japanese patent Application No. 2019-120797, 14 pages.
Office Action dated Jun. 23, 2020 in Japanese Patent Application No. 2019-120797, 14 pages.
Japanese Office Action dated Jun. 1, 2021 in Japanese Application No. 2019-120797.
Office Action dated Sep. 23, 2020, in corresponding Japanese Application No. 2019-120797, 12 pages.

* cited by examiner

F I G. 3
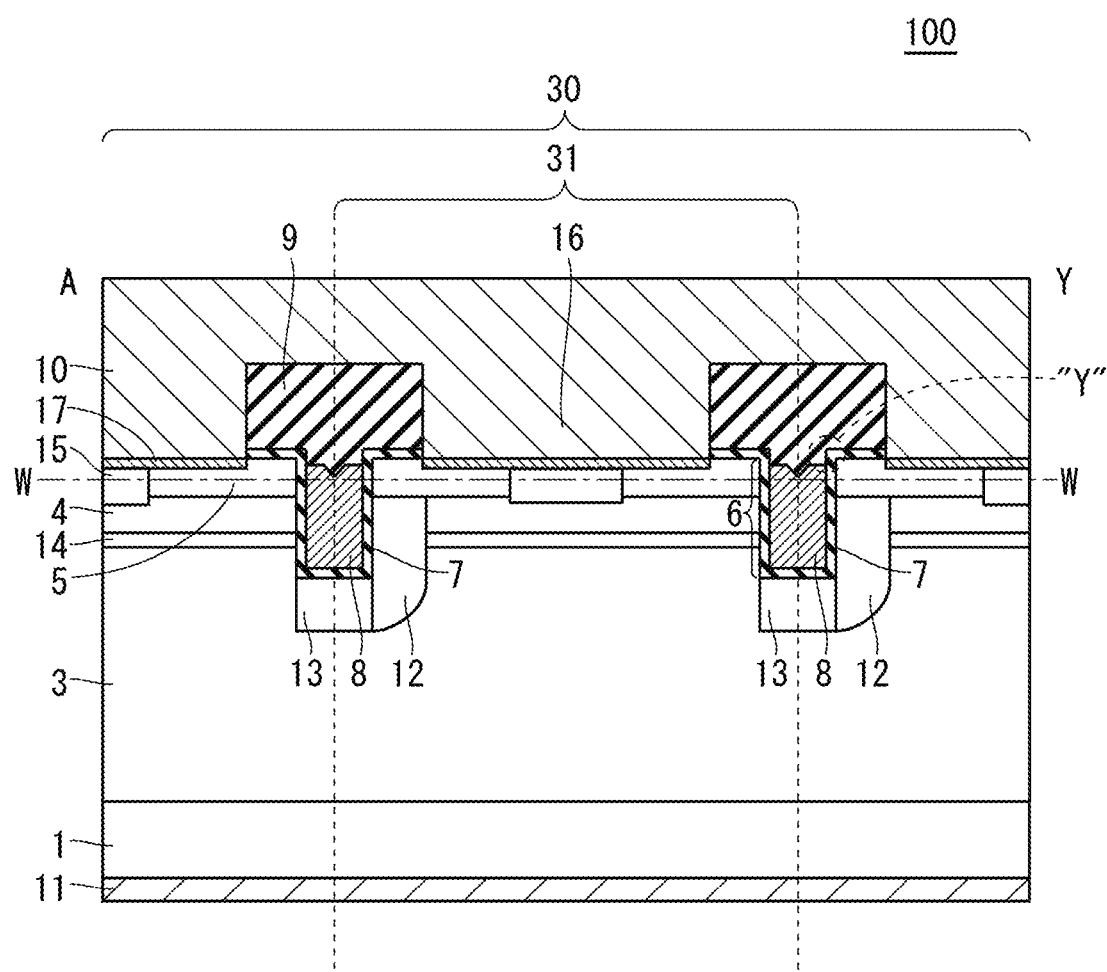

F I G. 4
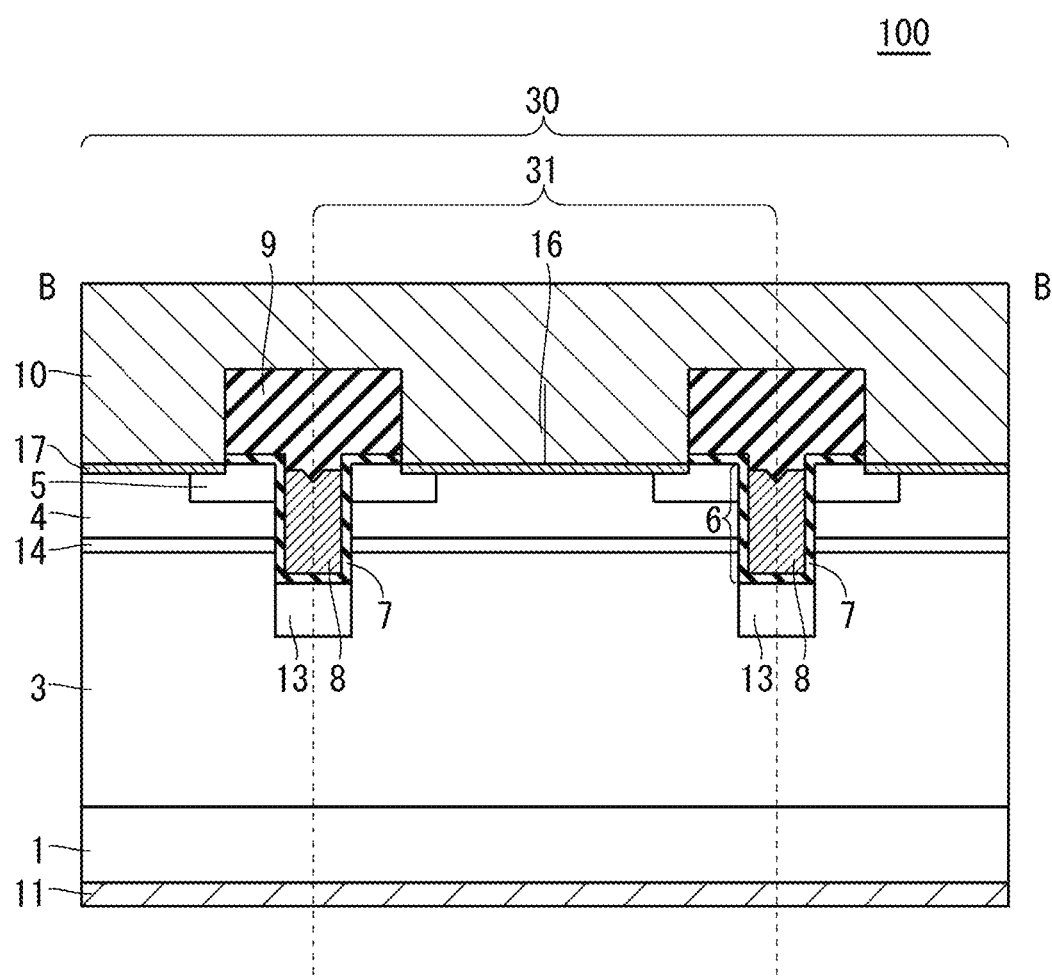

F I G. 7
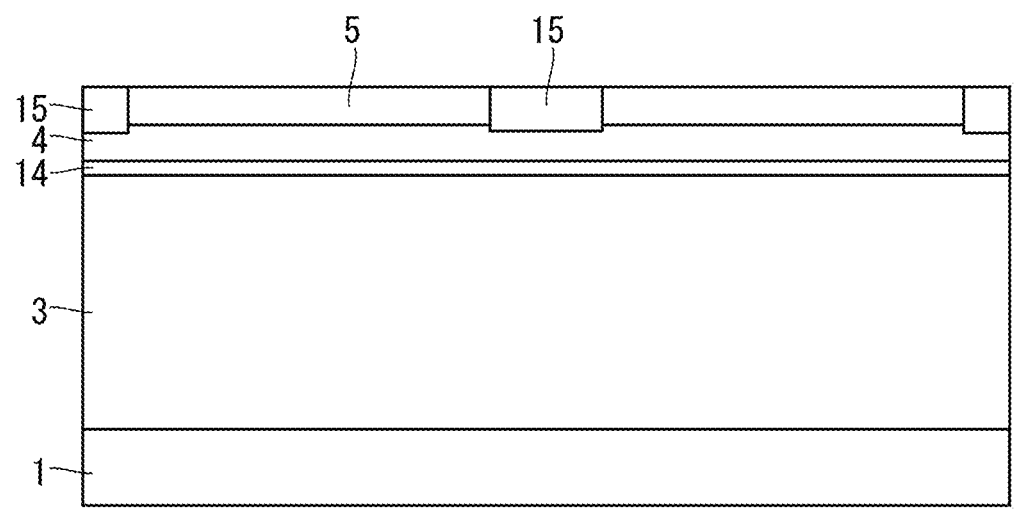
F I G. 8
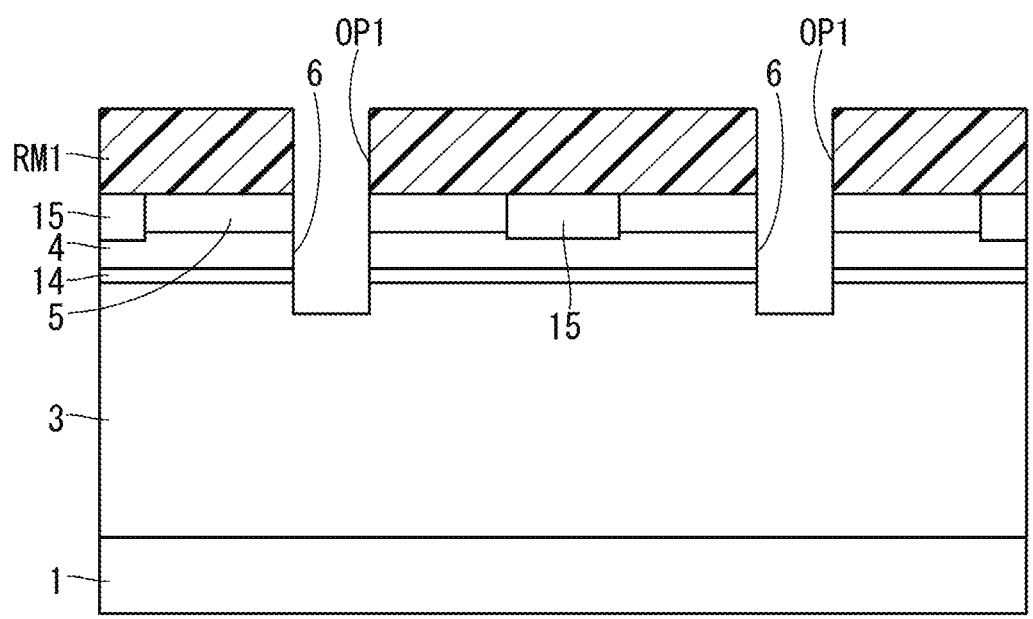

F I G. 1 5
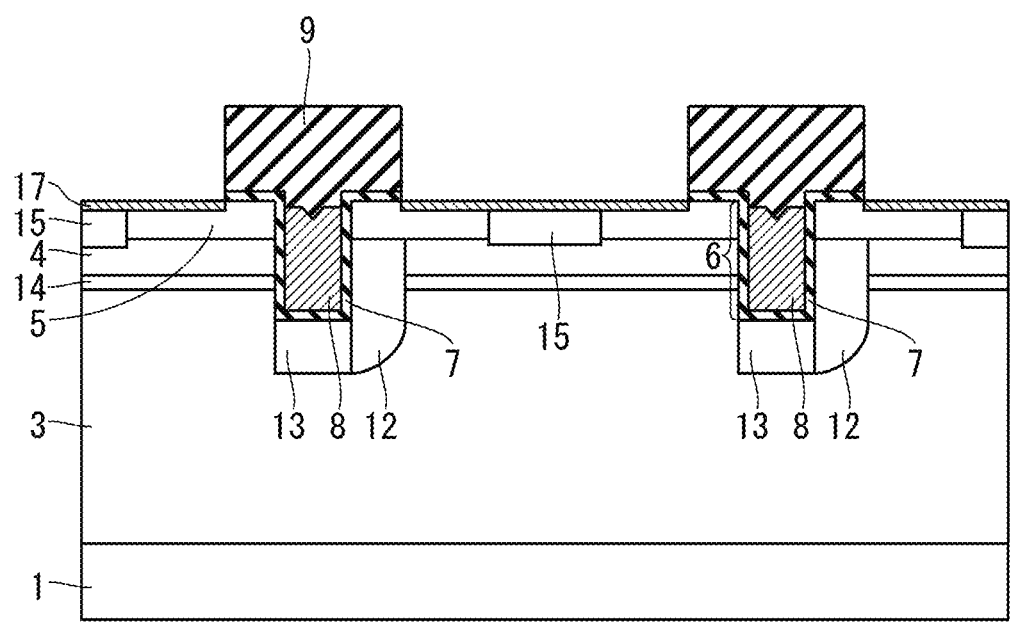

F I G. 1 8
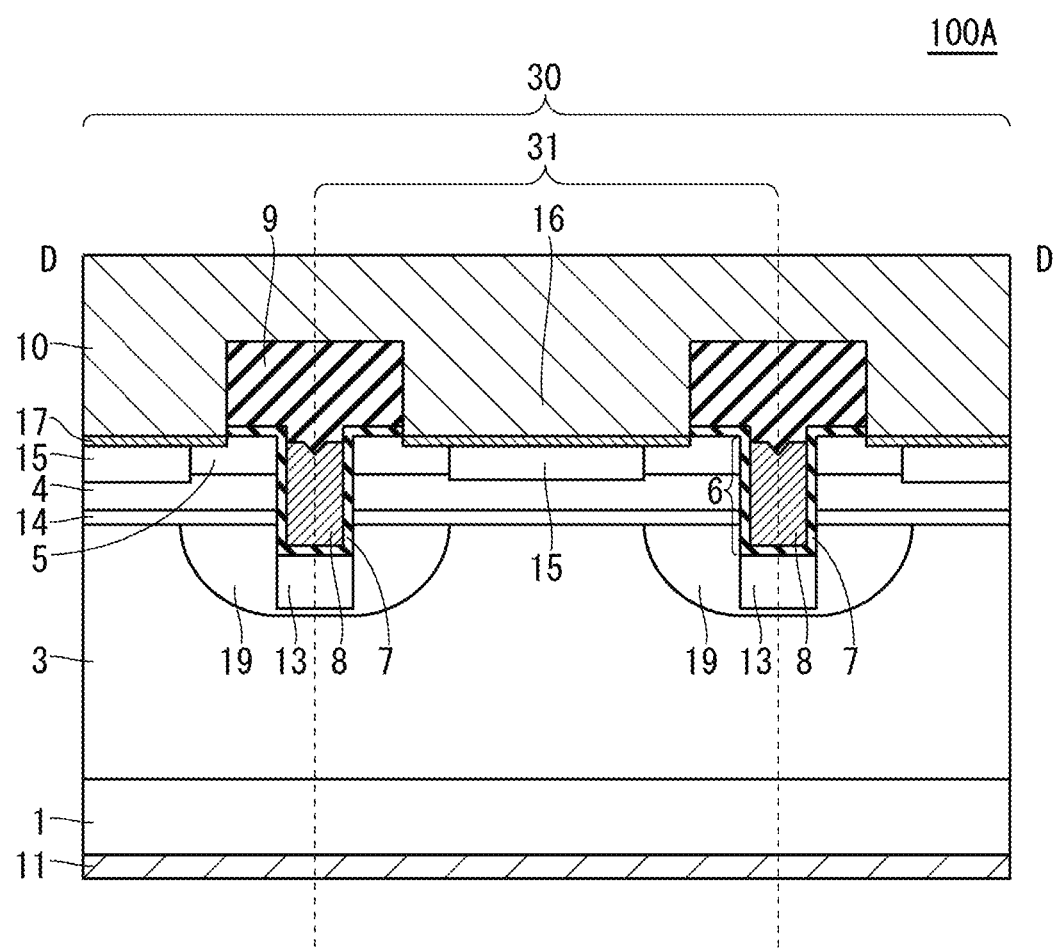

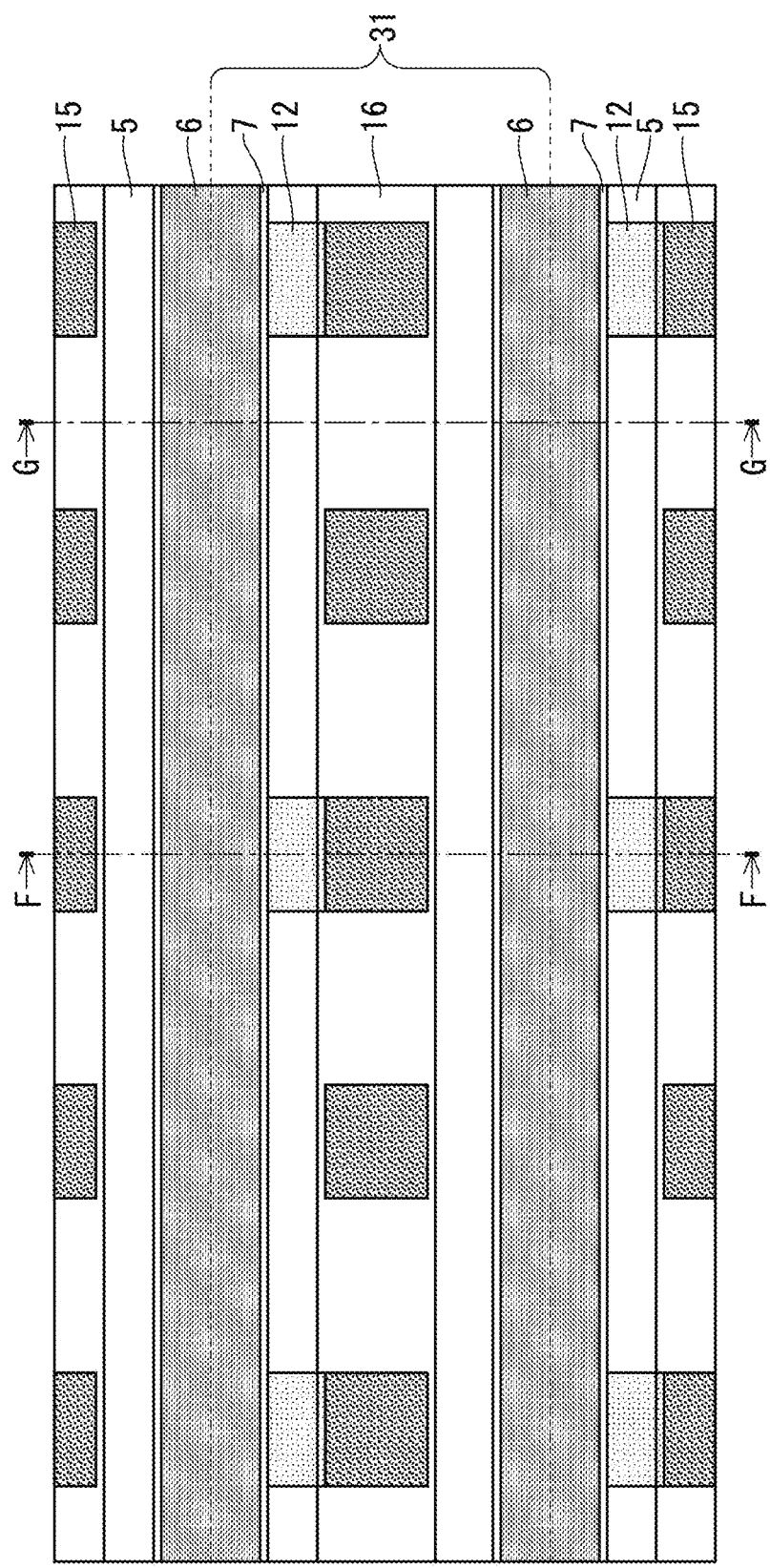

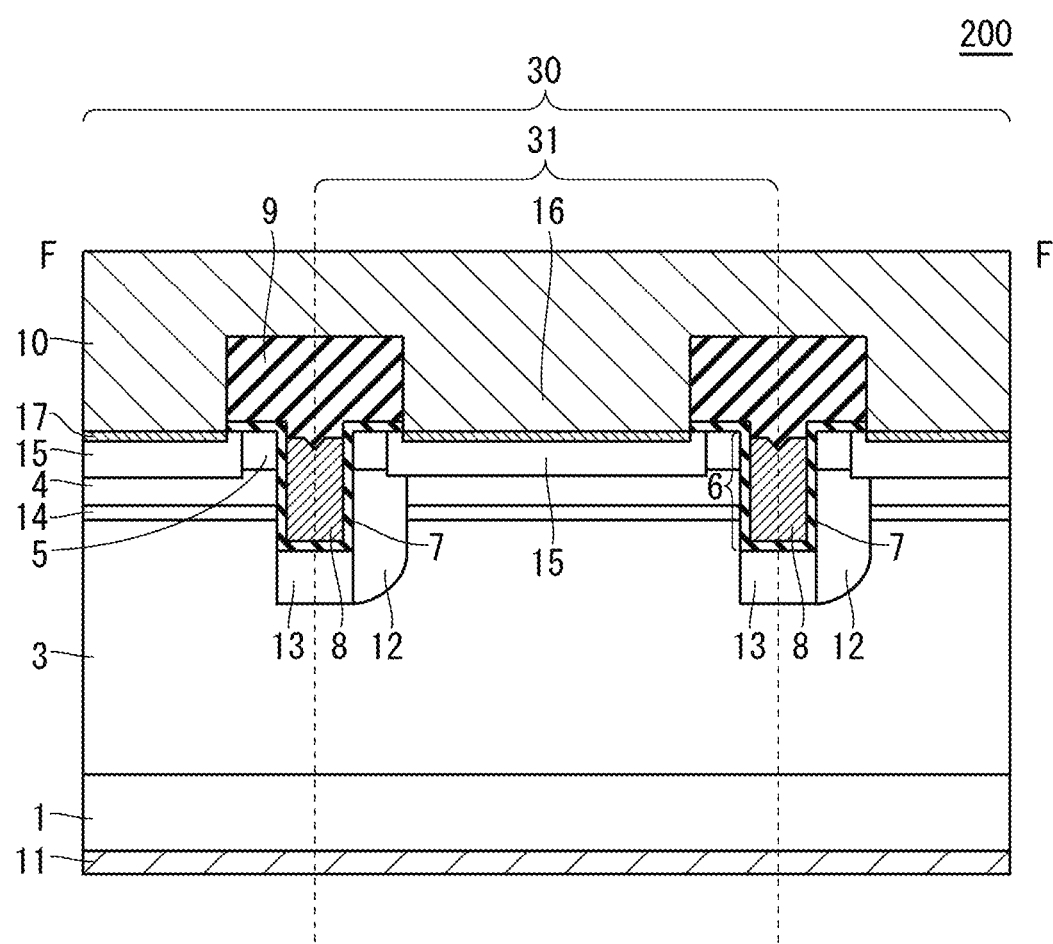
F I G. 2 4

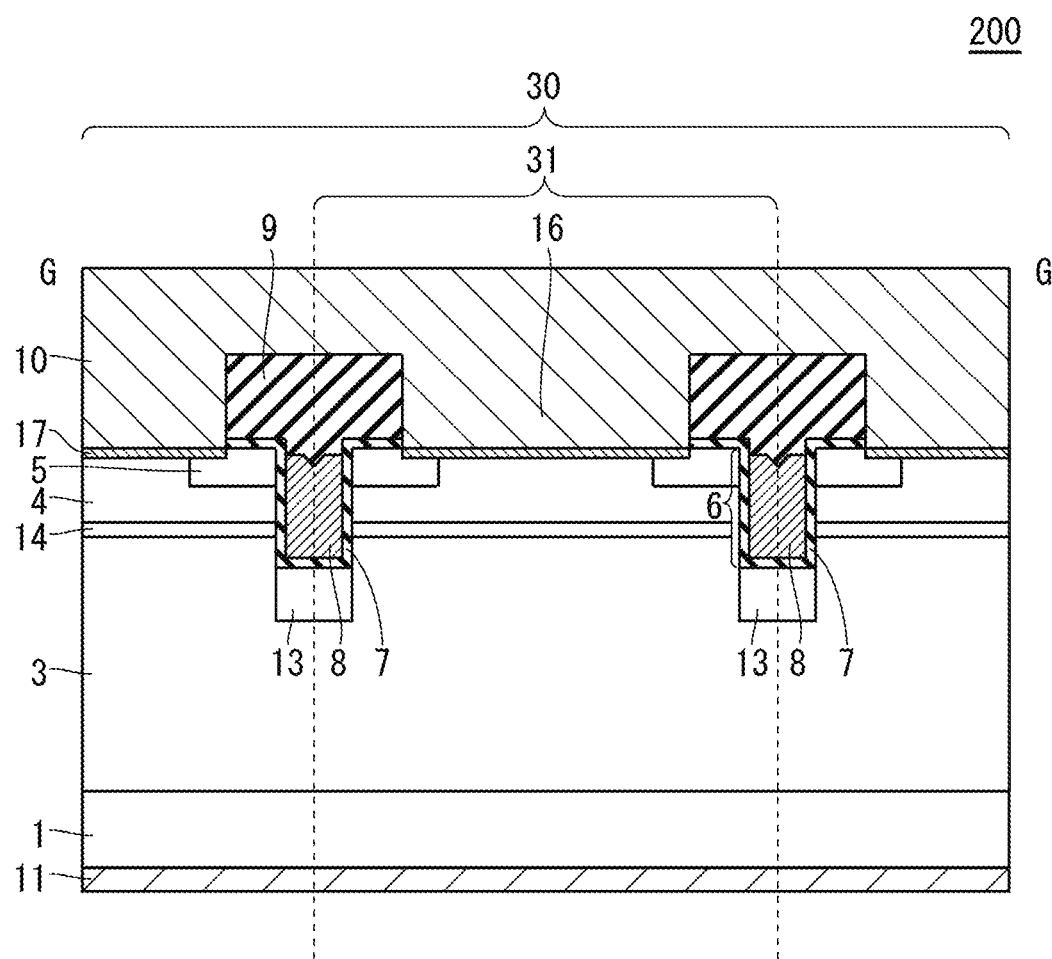
F I G. 2 5

F I G. 2 7
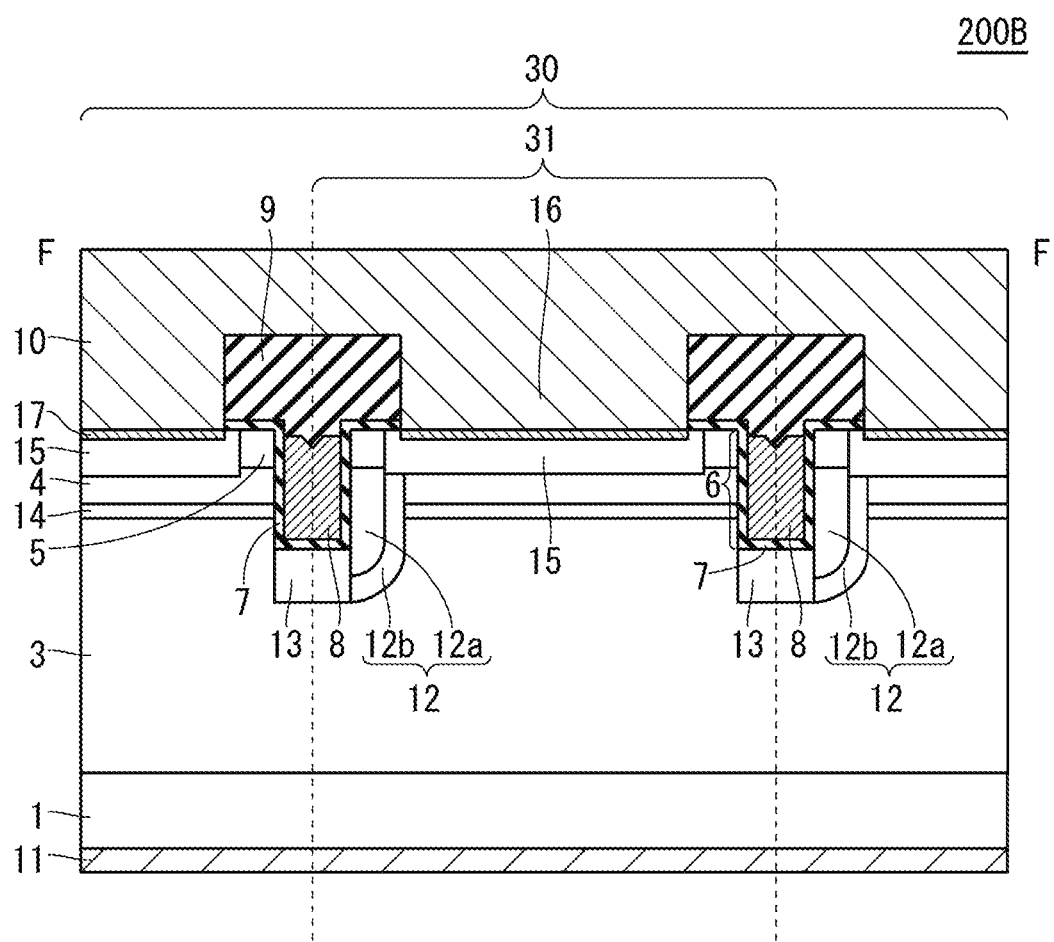

F I G. 2 8
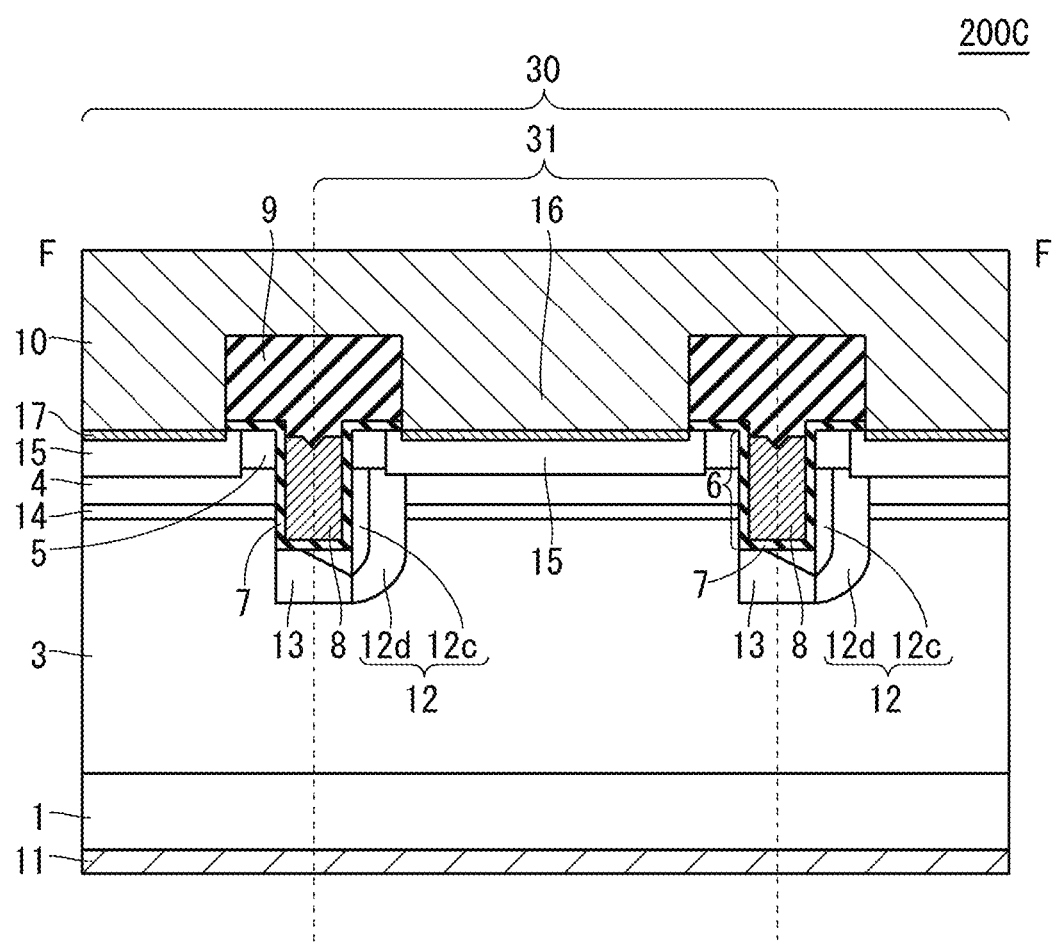

F I G. 3 0
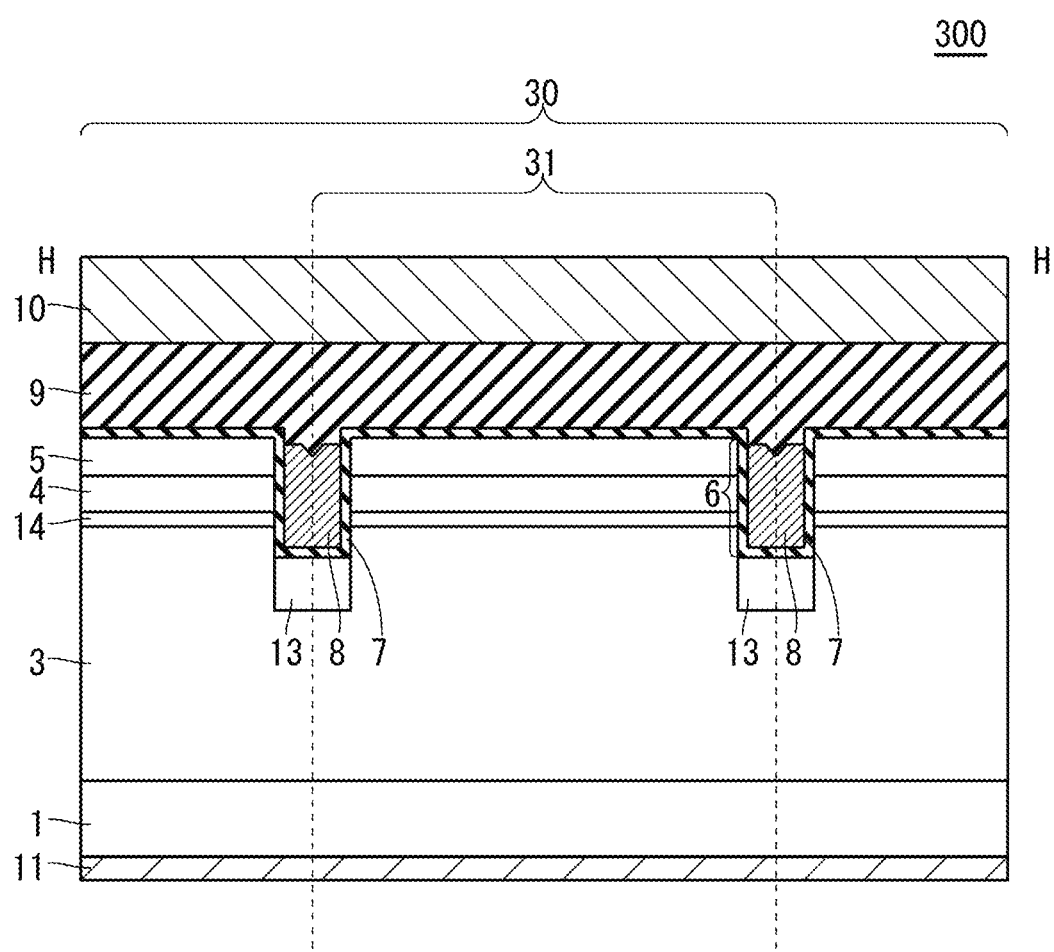

F I G. 3 2
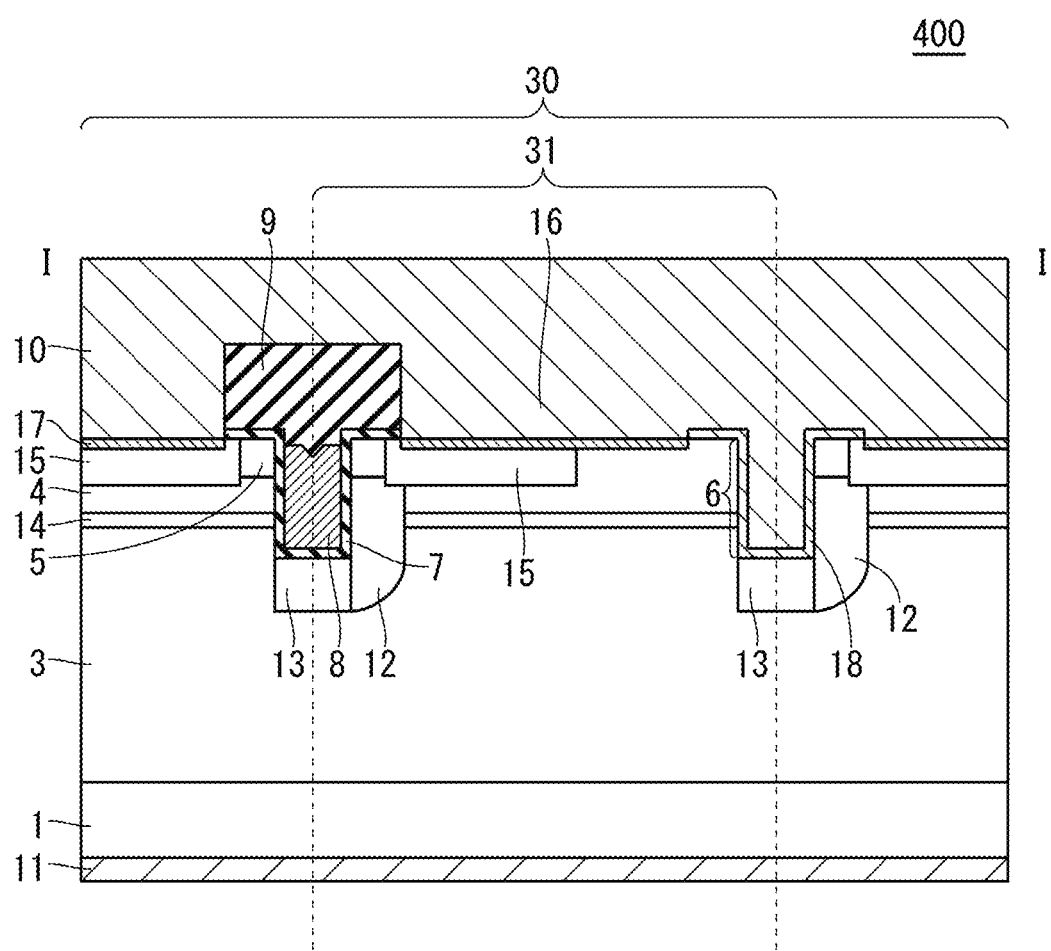

F I G. 3 3
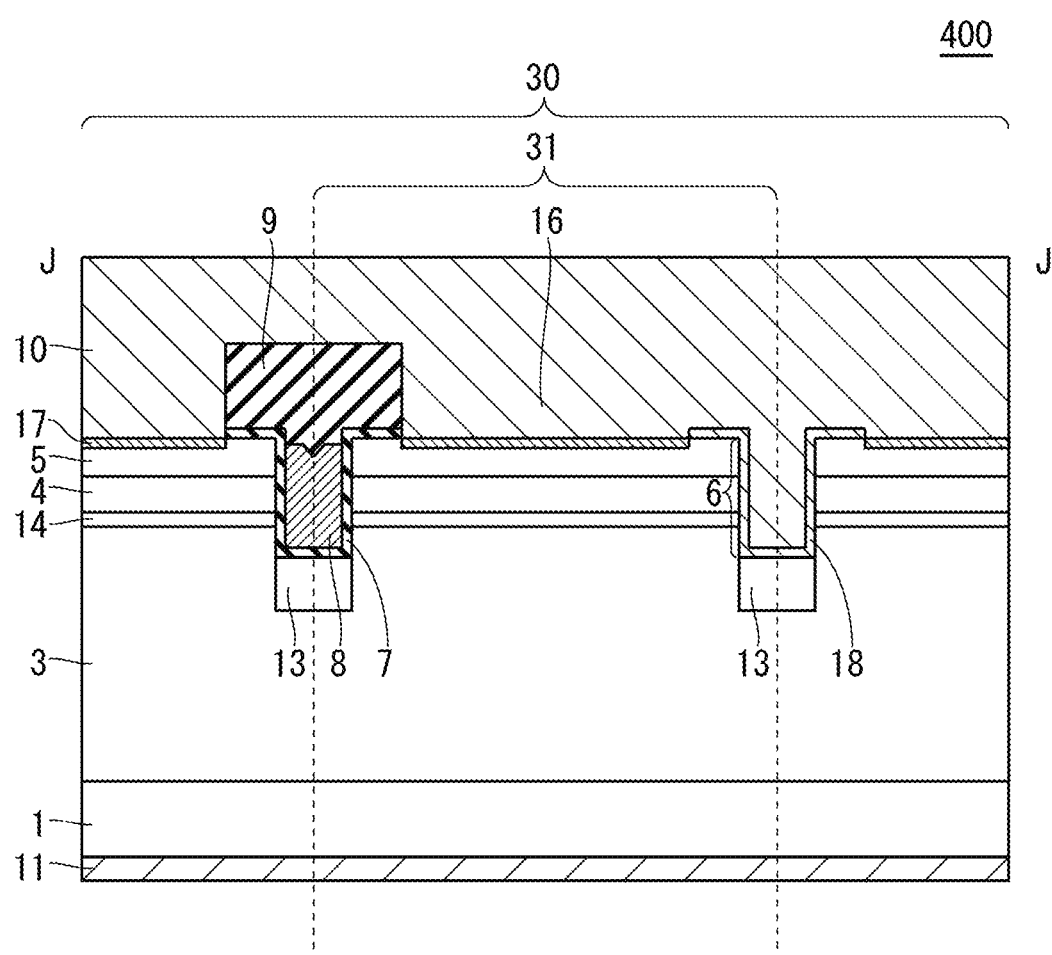

F I G. 3 4
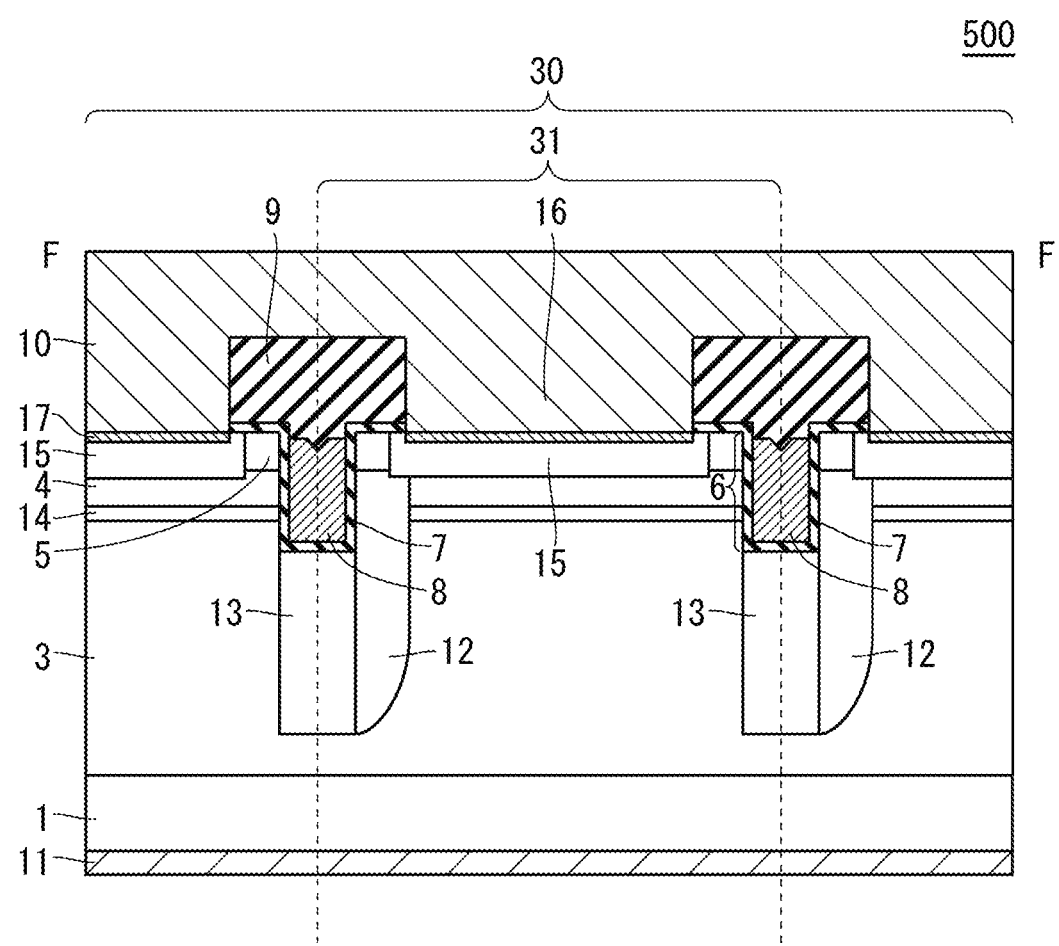

SEMICONDUCTOR DEVICE AND POWER CONVERTER

CROSS-REFERENCE TO RELATED APPLICATIONS

The present application is based on PCT filing PCT/JP2018/020723, filed May 30, 2018, which claims priority to JP2017-111336, filed Jun. 6, 2017, the entire contents of each are incorporated herein by reference.

TECHNICAL FIELD

The present invention relates to semiconductor devices, and particularly, to a semiconductor device having trench gates.

BACKGROUND ART

A power electronic apparatus includes switching devices, such as silicon insulated-gate bipolar transistors (IGBTs) and metal-oxide-semiconductor field-effect transistors (MOSFETs), as means for switching between the execution and stop of power supply for driving a load (e.g., an electric motor).

A MOSFET of vertical structure (i.e., vertical MOSFET) and an IGBT of vertical structure (i.e., vertical IGBT) are frequently employed as switching devices, which are expected to be used as power semiconductor devices. Such vertical MOSFETs are divided into several types according to their gate structures: a vertical MOSFET of planar type, a vertical MOSFET of trench type (trench-gate type), and other types.

A trench-gate MOSFET that includes gate trenches (i.e., grooves) formed in an active region of a drift layer of first conductivity type (n-type) receives, due to its structural reason, a high electric field that is applied to a gate insulating film on the bottom surfaces of the gate trenches when the MOSFET is turned off. Such field application can break down the gate insulating film at the bottom surfaces of the gate trenches. To address this problem, Patent Document 1 provides a technique of forming a field-reducing region (i.e., protective diffusion layer) of second conductivity type (p-type) over the bottom surfaces of gate trenches, thus reducing an electric field that is applied to a gate insulating film on the bottom surfaces of the gate trenches.

Patent Document 1 further provides a technique of forming a second base region onto a trench sidewall surface with a large off-angle, and connecting the protective diffusion layer to a ground potential. Such a structure allows a depletion layer that extends from the protective diffusion layer to the drift layer during switching operations, to well respond, thereby reducing switching loss.

Patent Document 2 discloses a technique of reducing field concentration at trench bottoms by forming a p-type deep layer that extends in a direction perpendicular to a direction in which a plurality of gate trenches extend, and is in contact with the side surfaces and bottom surfaces of the gate trenches.

PRIOR ART DOCUMENTS

Patent Documents

Patent Document 1: International Publication No. 2014/122919
Patent Document 2: Japanese Patent Application Laid-Open No. 2009-302436

SUMMARY

Problem to be Solved by the Invention

There are a couple of problems in the configuration disclosed in Patent Document 1. These problems arise because the second base region is formed in a crystal surface with an off-angle having the smallest channel mobility.

The first one is that if the second base region is formed on an entire trench sidewall surface having small channel mobility, channel density lowers to a great degree, thus possibly increasing ON-resistance. The second one is that if the second base region is formed only part of a trench sidewall surface with small channel mobility, the channel mobility of other trench sidewall surfaces on which channels are formed, is not necessarily uniform.

This is because in the other trench sidewall surfaces on which the channels are formed, partly active portions in the trench sidewall surfaces having low channel mobility, and trench sidewall surfaces not having low channel mobility are present; hence, the channel mobility is not uniform.

As a result, the reliability of a switching device can degrade due to current concentration in a particular channel surface. In addition, operational characteristics can become unstable due to fluctuations in threshold voltage.

To maintain breakdown voltage when the MOSFET is turned off, the configuration disclosed in Patent Document 2 has no choice but to form p-type deep layers densely at intervals, thus increasing the ON-resistance of the switching device because channel density lowers to a great degree.

To solve this problem, it is an object of the present invention to provide a semiconductor device that improves its reliability and operational characteristics by reducing electric fields at the bottom surfaces of gate trenches, and that keeps its ON-resistance low and causes no current concentration in a particular channel surface and no fluctuations in threshold voltage.

Means to Solve the Problem

A semiconductor device according to the present invention includes the following: a first semiconductor layer of a first conductivity type; a first semiconductor region of the first conductivity type selectively disposed in the upper layer of the first semiconductor layer; a second semiconductor region of a second conductivity type disposed in the upper layer of the first semiconductor layer so as to be in contact with the first semiconductor region; a third semiconductor region of the second conductivity type disposed on the bottom surfaces of the first and second semiconductor regions; a plurality of gate trenches provided to penetrate the first and third semiconductor regions in a thickness direction of the first and third semiconductor regions, the gate trenches each having a bottom surface reaching the inside of the first semiconductor layer, the gate trenches being in the form of stripes and extending in one direction in plan view; a field-reducing region of the second conductivity type disposed on the bottom surface of each gate trench; an interlayer insulating film having contact openings above the first and second semiconductor regions; a plurality of connection layers arranged in the first semiconductor layer so as to be each in contact with at least one of sidewalls of a corresponding one of the plurality of gate trenches in a second direction perpendicular to a first direction parallel with a direction in which the gate trenches extend, the intervals between the plurality of connection layers adjacent to each other in the first direction being set to be as large as or larger than an interval at which the plurality of gate trenches are arranged, the connection layers each electrically connecting the field-reducing region to the third semiconductor region; a first main electrode disposed over the interlayer insulating film and filled in the contact opening; and a second main electrode disposed on a main surface of the first semiconductor layer, the main surface being opposite from where the first main electrode is disposed. The first semiconductor layer has an off-angle greater than 0 degrees. The first direction is parallel with an off-direction. The connection layers are spaced from each other in the first direction.

Effects of the Invention

The semiconductor device according to the present invention, which includes the field-reducing region on the bottom surface of the gate trench, reduces electric fields that are applied to the bottom surfaces of the gate trenches when the semiconductor device is in OFF state. The semiconductor device, which includes the connection layer connecting the field-reducing region to the third semiconductor region, also allocates a current path for charge and discharge at a pn junction formed by the field-reducing region and first semiconductor layer, thereby reducing switching loss.

BRIEF DESCRIPTION OF DRAWINGS

FIG. 3 is a cross-sectional view showing the configuration of the semiconductor device according to the first embodiment of the present invention.

FIG. 4 is a cross-sectional view showing the configuration of the semiconductor device according to the first embodiment of the present invention.

FIG. 7 is a cross-sectional view showing a process step for manufacturing the semiconductor device according to the first embodiment of the present invention.

FIG. 8 is a cross-sectional view showing a process step for manufacturing the semiconductor device according to the first embodiment of the present invention.

FIG. 15 is a cross-sectional view showing a process step for manufacturing the semiconductor device according to the first embodiment of the present invention.

FIG. 18 is a cross-sectional view showing the configuration of the semiconductor device according to the modification of the first embodiment of the present invention.

FIG. 23 is a plan view showing the configuration of a semiconductor device according to a second embodiment of the present invention.

FIG. 24 is a cross-sectional view showing the configuration of the semiconductor device according to the second embodiment of the present invention.

FIG. 25 is a cross-sectional view showing the configuration of the semiconductor device according to the second embodiment of the present invention.

FIG. 27 is a cross-sectional view showing the configuration of a semiconductor device according to a modification of the second embodiment of the present invention.

FIG. 28 is a cross-sectional view showing the configuration of a semiconductor device according to a modification of the second embodiment of the present invention.

FIG. 30 is a cross-sectional view showing the configuration of the semiconductor device according to the third embodiment of the present invention.

FIG. 32 is a cross-sectional view showing the configuration of the semiconductor device according to the fourth embodiment of the present invention.

FIG. 33 is a cross-sectional view showing the configuration of the semiconductor device according to the fourth embodiment of the present invention.

FIG. 34 is a cross-sectional view showing the configuration of a semiconductor device according to a fifth embodiment of the present invention.

DESCRIPTION OF EMBODIMENT(S)

<Introduction>

The following describes the embodiments of the present invention with reference to the accompanying drawings. The drawings are schematic. The mutual relationship between the size and position of images shown in different drawings is not necessarily exact, and is subject to change as necessary. In the following description, like components are illustrated with the same signs, and have like names and functions. The description thereof will not be elaborated in some cases.

In some cases, the following description uses terms meaning particular positions and directions (e.g., "top", "down", "side", "bottom", "front", and "back"). These terms are merely used for easy understanding of what is disclosed in each embodiment, and thus have nothing to do with practical directions.

A long ago, the term "MOS" is used for a structure in which a metal, oxide, and semiconductor are joined together, and is an abbreviation for a "metal-oxide semiconductor". In view of recent-year integration, improvement in fabrication processes, and other things, a field-effect transistor having a MOS structure (hereinafter simply referred to as a "MOS transistor"), in particular, includes a gate insulating film and gate electrode that are made of improved material.

For instance, a MOS transistor includes a gate electrode of polycrystalline silicon instead of metal in order to form its source and drain in a self-aligned manner. In addition, to improve electrical properties, the gate insulating film is made of high-permittivity material, which is not necessarily limited to an oxide.

As such, the term "MOS" is not necessarily used for only a stacked structure of a metal, oxide, and semiconductor. Thus, the Description does not use this term based on such a limitation. That is, in view of technical common sense, the term "MOS" herein is not only an abbreviation for its etymology, but also widely means a stacked structure of an electric conductor, insulator, and semiconductor.

Reference is made to conductivity types of impurity. The following description generally defines n-type as a "first conductivity type" and defines p-type as a "second conductivity type". These definitions are reversible.

First Embodiment

<Device Configuration>

Figure 1:
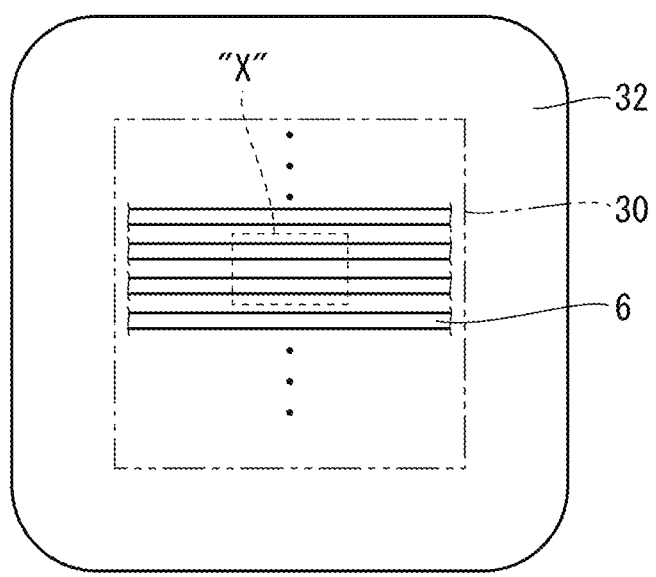
FIG. 1 is a plan view schematically showing the configuration of the upper surface of an entire semiconductor device according to the present invention.

FIG. 1 is a plan view schematically illustrating the configuration of the upper surface of an entire semiconductor device according to the present invention. As shown in FIG. 1, the semiconductor device according to the present invention has a quadrangular appearance. Disposed in the center of the semiconductor device is an active region 30 in which a plurality of minimum-unit structures (MOSFET cells) of a MOSFET, called "unit cells", are arranged. The active region 30 is surrounded by a termination region 32. The active region 30 includes a plurality of gate trenches 6 arranged in parallel with each other at intervals. The gate trenches 6 are connected to gate wires disposed in the active region 30. The gate wires are connected to a gate pad. The illustration and description of the gate wires and gate pad will not be elaborated upon.

Figure 2:
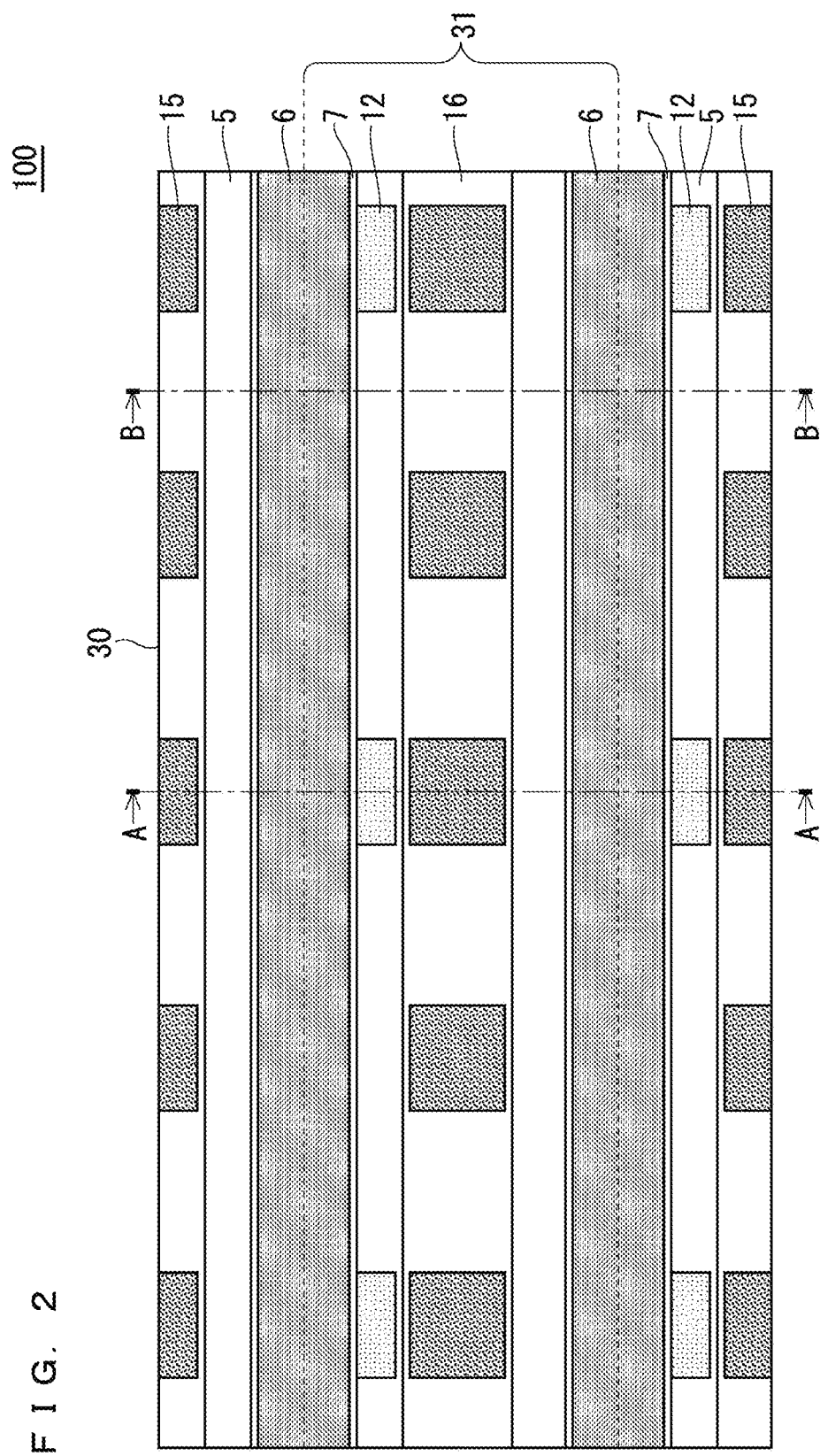
FIG. 2 is a plan view showing the configuration of a semiconductor device according to a first embodiment of the present invention.
Figure 5:
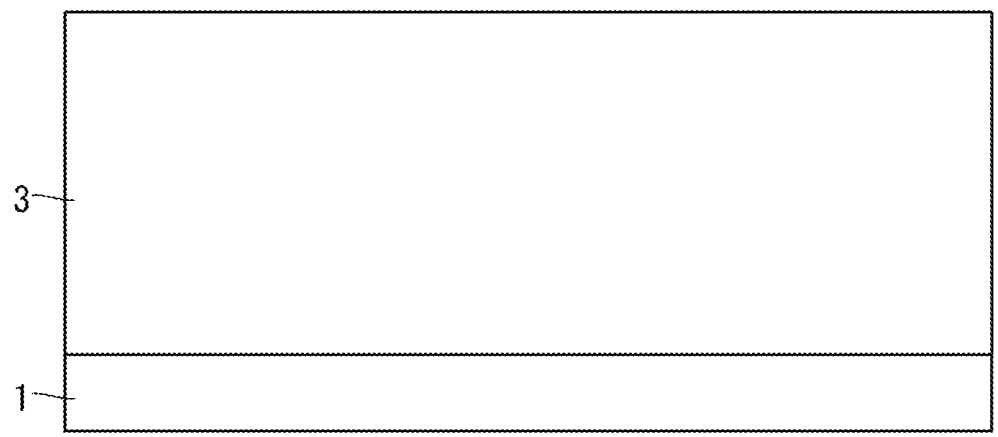
FIG. 5 is a cross-sectional view showing a process step for manufacturing the semiconductor device according to the first embodiment of the present invention.
Figure 6:
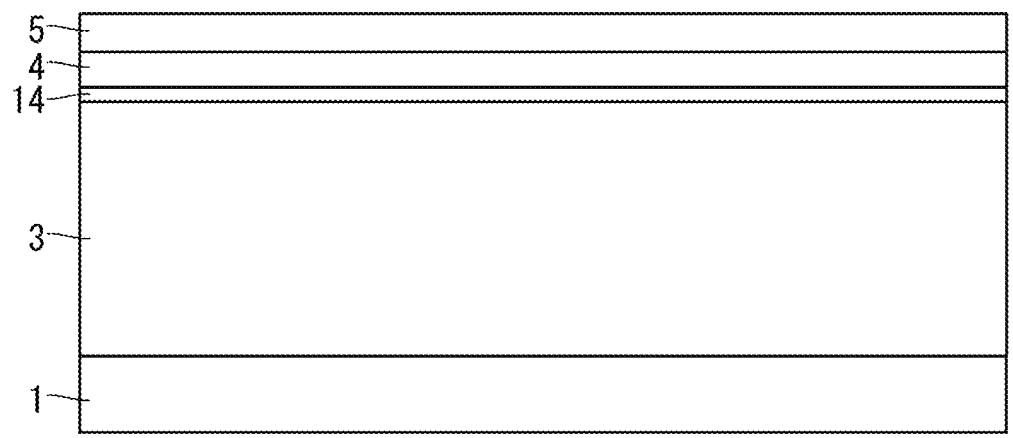
FIG. 6 is a cross-sectional view showing a process step for manufacturing the semiconductor device according to the first embodiment of the present invention.

FIG. 2 is an enlarged plan view of region "X" shown in FIG. 1. Hereinafter, characteristic configurations of region "X" are described as the embodiments of the present invention and their modifications. Moreover, FIG. 1 is commonly used, for description, in the embodiments and their modifications.

FIG. 2 is a plan view showing the configuration of a semiconductor device according to a first embodiment of the present invention. To be more specific, FIG. 2 is a plan view showing a characteristic portion of a trench-gate MOSFET 100 disposed on a silicon-carbide semiconductor substrate (i.e., SiC substrate). As shown in FIG. 2, the trench-gate MOSFET 100 in the first embodiment includes a unit cell 31 consisting of two adjacent gate trenches 6 and impurity regions disposed between the two gate trenches 6.

The gate trenches 6 are arranged in the form of stripes so as to extend in a direction parallel with an off-direction of the silicon-carbide semiconductor substrate. The gate trenches 6 divide the active region 30 into MOSFET cell units. The gate trenches 6 have their inner walls covered with gate insulating films 7. The regions surrounded by the gate insulating films 7 are filled with gate electrodes 8. The active region 30 between the gate trenches 6 is provided with source contacts 16 penetrating an interlayer insulating film (not shown). The source contacts 16 have their bottom surfaces provided with a plurality of well contacts 15.

The opening widths of the source contacts 16 are formed to be uniform in the active region 30. In other words, these opening widths in a direction (i.e., second direction, which is the lateral direction of FIG. 3) perpendicular to a direction (i.e., first direction, which is the lateral direction of FIG. 2) in which the gate trenches 6 extend, are desirably uniform, and more specifically, the opening widths desirably fall within a range of ±25%. If the opening widths of the source contacts 16 are not uniform in the active region 30, the source electrode 10 can fail to be filled inside the source contacts 16 uniformly. If the source electrode 10 can fail to be filled inside the source contacts 16 uniformly, the semiconductor device no longer has a flat surface, thus possibly degrading reliability in assembly and packaging. Making the opening widths of the source contacts 16 uniform in the active region 30 causes no such problem.

FIG. 3 is a cross-sectional view taken along line A-A denoted by arrows in FIG. 2. FIG. 4 is a cross-sectional view taken along line B-B denoted by arrows in FIG. 2, and shows the periodic configuration of the unit cell 31 at a location including the gate trenches 6 in its cross-section in the active region 30. For convenience, FIG. 2 omits a configuration above from line W-W in FIG. 3 to help the understanding of how sidewall well connection layers 12 are arranged in a drift layer 3.

As shown in FIG. 3, the trench-gate MOSFET 100 in the first embodiment includes the following: the drift layer 3 of n-type (i.e., first semiconductor layer) disposed on one of main surfaces (i.e., first main surface) of a silicon-carbide semiconductor substrate 1; a highly doped layer 14 of n-type (i.e., second semiconductor layer) disposed on the drift layer 3; a well region 4 of p-type (i.e., third semiconductor region) disposed on the highly doped layer 14; a source region 5 of n-type (i.e., first semiconductor region) disposed on the well region 4; and the well contact region 15 of p-type (i.e., second semiconductor regions) disposed on the well region 4. The gate trenches 6, penetrating the source region 5, well region 4 and highly doped layer 14 in their thickness direction from the top surface of the source region 5 to reach the inside of the drift layer 3, have their bottom surfaces under which trench-bottom-surface field-reducing regions 13 of p-type (i.e., field-reducing regions) are disposed. Each sidewall well connection layer 12 of p-type (i.e., connection layer) is provided to be in contact with one of the side surfaces of the corresponding trench-bottom-surface field-reducing region 13 and one of the sidewalls of the corresponding gate trench 6.

The trench-gate MOSFET 100 also includes an interlayer insulating film 9 disposed over each gate trench 6 and its surroundings. The space between the gate trenches 6 that is not covered with the interlayer insulating film 9, is the source contact 16 (i.e., contact opening), the bottom surface of which is covered with a silicide film 17. The silicide film 17 is connected to the source electrode 10 (i.e., first main electrode) via the source contact 16. The trench-gate MOSFET 100 also includes a drain electrode 11 (i.e., second main electrode) disposed on the other main surface (i.e., second main surface) of the silicon-carbide semiconductor substrate 1, which is opposite from where the source electrode 10 is disposed.

Here, the silicon-carbide semiconductor substrate 1 has a polytype of 4H. In addition, the main surfaces of the silicon-carbide semiconductor substrate 1 and a main surface of the drift layer 3 are (0001) planes each having an off-angle θ inclined in a [11-20]-axis direction. The off-angle θ needs to be 10 degrees or less for instance.

The well region 4 in the upper layer of the drift layer 3 is disposed in the active region 30, in which the MOSFET cells are arranged. The source region 5 and the well contact region 15 are selectively (partly) disposed in the well region 4. The well contact region 15 is surrounded by the source region 5 in plan view, as shown in FIG. 2.

Each gate trench 6 is filled with the gate electrode 8 with the gate insulating film 7 interposed between the gate trench 6 and the gate electrode 8. Each gate electrode 8 has an upper surface located deeper than the uppermost surface of the source region 5. In other words, the gate electrode 8 has an upper surface retracted from the opening end of the gate trench 6. This holds true for the cross-section taken along line B-B illustrated in FIG. 4.

The trench-bottom-surface field-reducing regions 13 under the respective bottom surfaces of the gate trenches 6 are provided for reducing electric fields that are applied to the bottom surfaces and side surfaces of the gate trenches 6 when the MOSFET is turned off. The trench-bottom-surface field-reducing regions 13 are desirably in contact with the respective gate trenches 6.

Each sidewall well connection layer 12, provided to be in contact with part of the side surface of the corresponding trench-bottom-surface field-reducing region 13 and part of the sidewall of the corresponding gate trench 6, is also in contact with the well region 4 and electrically connects the trench-bottom-surface field-reducing region 13 to the well region 4.

The sidewall well connection layer 12 is merely in contact with part of the sidewall of the gate trench 6, as illustrated in FIGS. 2 and 4. In FIG. 2, the sidewall well connection layer 12 is discontinuously disposed on only one of the sidewalls of the gate trench 6.

The sidewall of each gate trench 6 under the application of a gate bias have an inverting channel formed in a portion without the sidewall well connection layer 12. This inverting channel serves as a channel region of the MOSFET. At this time, channel properties of each sidewall of the gate trench 6 are configured to be about identical and are configured so as not to be non-uniform.

In other words, setting the direction in which the gate trenches 6 extend (i.e., first direction) to be parallel with a <11-20> direction, which is an off-direction, makes the trench sidewall almost close to a (1-100) plane and (-1100) plane perpendicular to a (0001) plane. Consequently, even when the drift layer 3 has an off-angle in the <11-20> direction, the drift layer 3 is not affected by the anisotropy of electric properties resulting from differences between crystal surfaces in each trench sidewall, thereby achieving identical and uniform channel properties.

This eliminates the need to form the sidewall well connection layer 12 on an entire particular trench sidewall, thus preventing reduction in channel density and increase in the ON-resistance of the MOSFET. No trench gates are included that have channel properties different from each other, thus causing no current concentration in a particular channel surface and no instability in a threshold voltage.

Since the gate trench 6 penetrates the source region 5, the source region 5 of n-type is disposed in a portion corresponding to the corner of the opening end of the gate trench 6. However, the corner of the opening end of the gate trench 6, indicated by region "Y", is covered with the gate insulating film 7 and the interlayer insulating film 9. The upper surface of the gate electrode 8 thus does not reach the corner of the opening end. That is, the source region 5 and the gate electrode 8 do not face each other via the gate insulating film 7, at the corner of the opening end of the gate trench 6 in the active region 30.

It is noted that the entire active region 30 does not have to take the plan-view configuration and cross-sectional configurations illustrated in FIGS. 2 to 4. Part of the active region 30 may take these configurations. It is also noted that the ratio between the cross-sectional configuration in FIG. 3 and the cross-sectional configuration in FIG. 4 is non-limiting. The ratio can be set freely; in one embodiment, the ratio of one of these cross-sectional configurations is more than the other, and one of them is less than the other.

<Method of Manufacture>

In the following description, when the impurity concentration of each impurity layer and impurity region has a concentration profile, impurity concentration (cm$^{-3}$) indicates the peak value of the impurity concentration of each impurity layer and impurity region.

An n-type impurity needs to be nitrogen (N) or phosphorus (P) for instance. A p-type impurity needs to be aluminum (Al) or boron (B) for instance.

The following describes a method for manufacturing the trench-gate MOSFET 100 according to the first embodiment, with reference to FIGS. 5 to 15, which are cross-sectional views showing process steps sequentially.

The first step (c.f., FIG. 5) is epitaxially growing the drift layer 3 of silicon carbide that contains a relatively low concentration of n-type impurities (n$^-$) and has a relatively high resistance, onto one of the main surfaces of the n-type silicon-carbide semiconductor substrate 1 in the form of a wafer having a polytype of 4H. At this time, the drift layer 3 is formed to have an impurity concentration of $1 \times 10^{14}$ cm$^{-3}$ or more and $1 \times 10^{17}$ cm$^{-3}$ or less.

The drift layer 3 then undergoes photolithography with reference to an alignment mark disposed on a dicing line through reactive ion etching (RIE). The next step (c.f., FIG. 6) is forming an ion-implantation mask (not shown) onto the drift layer 3 and injecting impurity ions via the ion-implantation mask to form, in the upper layer of the drift layer 3, the highly doped layer 14 that contains a relatively high concentration of n-type impurities (n+) and has a relatively low resistance, followed by forming the p-type well region 4 in the upper surface of the highly doped layer 14, followed by forming, in the upper layer of the p-type well region 4, the source region 5 that contains a relatively high concentration of n-type impurities (n+) and has a relatively low resistance. An example of the ion-implantation mask usable herein is a resist mask.

The source region 5 is formed to have an impurity concentration of $5\times10^{18}$ cm$^{-3}$ or more and $5\times10^{20}$ cm$^{-3}$ or less. In addition, the well region 4 is formed to have an impurity concentration of $1\times10^{16}$ cm$^{-3}$ or more and $3\times10^{19}$ cm$^{-3}$ or less. Moreover, the n-type impurity concentration of the source region 5 is set to be higher than the p-type impurity concentration of the well region 4 in order to form the n-type source region 5 in the upper layer of the p-type well region 4.

The highly doped layer 14 is formed to have an impurity concentration of $5\times10^{16}$ m$^{-3}$ or more and $1\times10^{18}$ cm$^{-3}$ or less. The highly doped layer 14 serves as a current spreading layer when the MOSFET is turned on, and is capable of lowering the ON-resistance.

The concentration of the well region 4 may or may not be uniform in its depth direction. For instance, the concentration may take a distribution such that the surface concentration of the well region 4 lowers, or a distribution such that the surface concentration has a peak in the depth direction of the well region 4.

The next step (c.f., FIG. 7) is forming the p-type well contact regions 15 in the source region 5 through ion implantation. At this time, the well contact regions 15 are formed to have a p-type impurity concentration of $1\times10^{19}$ cm$^{-3}$ or more and $1\times10^{22}$ cm$^{-3}$ or less. The well contact regions 15 are also formed to be as thick as or thicker than the source region 5, so that the well contact regions 15 come into contact with the well region 4 certainly. It is noted that these impurity layer and impurity region may be formed in the drift layer 3 in any order.

The next step (c.f., FIG. 8) is patterning, with a resist material, an etching mask RM1 having openings OP1 at locations corresponding to regions for forming the gate trenches 6, onto the drift layer 3 that is now provided with the source region 5 and well contact region 15. The etching mask RM1 needs to be formed with reference to the aforementioned alignment mark. After the patterning, the gate trenches 6 are formed via the etching mask RM1 through RIE so as to penetrate the source region 5 and well region 4 in their thickness direction to reach the inside of the drift layer 3.

The next step (c.f., FIG. 9) is forming the p-type trench-bottom-surface field-reducing regions 13 under the bottom surfaces of the respective gate trenches 6 by injecting p-type impurity ions using the etching mask RM1 as an ion-implantation mask. The trench-bottom-surface field-reducing regions 13 at this time have an impurity concentration of $1\times10^{17}$ cm$^{-3}$ or more and $1\times10^{20}$ cm$^{-3}$ or less.

After removing the etching mask RM1, the next step (c.f., FIG. 10) is patterning an ion-implantation mask RM11 using a resist material. The ion-implantation mask RM11 has a pattern in which openings OP11 are each disposed in only a portion including the sidewall of the corresponding gate trench 6 where the sidewall well connection layer 12 is to be disposed. In addition, the ion-implantation mask RM11 has no opening in a portion including the sidewall of the corresponding gate trench 6 where the sidewall well connection layer 12 is to be not disposed. Injecting the p-type impurity ions from an oblique direction via the ion-implantation mask RM11 (such injection is called oblique ion implantation) forms the sidewall well connection layers 12 each of which is in contact with one of the sidewalls of the corresponding gate trench 6 and one of the side surfaces of the corresponding trench-bottom-surface field-reducing region 13.

In the ion injection for forming the sidewall well connection layers 12, the silicon-carbide semiconductor substrate 1 in the form of a wafer is tilted. This ion implantation is performed under the following conditions: an incident angle ranging from 20 to 60 degrees with respect to implantation at 0 degrees, which is an implantation method of injecting impurities in a direction perpendicular to a wafer; an impurity concentration of $5\times10^{16}$ cm$^{-3}$ or more and $1\times10^{20}$ cm$^{-3}$ or less; and a depth (length in the thickness direction of the drift layer 3) of 0.3 μm or more from a surface of the well region 4. Accordingly, the sidewall of the gate trench 6 and the side surface of the trench-bottom-surface field-reducing region 13 are successfully covered with the sidewall well connection layer 12.

It is noted that although the foregoing has illustrated, by way of example, forming the trench-bottom-surface field-reducing regions 13, followed by forming the sidewall well connection layers 12, the sidewall well connection layers 12 may be formed, followed by the trench-bottom-surface field-reducing regions 13.

It is also noted that although the foregoing has illustrated, by way of example, forming the gate trenches 6, followed by forming the trench-bottom-surface field-reducing regions 13 and sidewall well connection layers 12, the trench-bottom-surface field-reducing regions 13 and the sidewall well connection layers 12 may be individually formed, and thereafter, the gate trenches 6 may be formed in locations where the respective trench-bottom-surface field-reducing regions 13 and sidewall well connection layers 12 are disposed. In this case, forming the trench-bottom-surface field-reducing regions 13 at a later stage enables the ion-implantation mask, which is used for ion injection into the trench-bottom-surface field-reducing regions 13, to be used to form the gate trenches 6. The ion implantation at this time may be performed in a direction perpendicular to the wafer.

The next step is annealing for 0.5 minutes or more and 60 minutes or less at a temperature of 1500° C. or more and 2200° C. or less, to activate the injected ions.

Furthermore, the silicon-carbide semiconductor substrate 1 undergoes thermal oxidation, chemical vapor deposition (CVD), or other methods to form an insulating film thereon, followed by wet etching or dry etching to form a field insulating film (not shown) for protecting the termination region 32 (c.f., FIG. 1).

Thereafter, the gate insulating film 7 is formed through thermal oxidation, CVD, or other methods, so as to cover the inner-wall surfaces and surroundings of the gate trenches 6.

The next step (c.f., FIG. 11) is forming a conductive layer PS (e.g., polysilicon layer) containing a relatively high concentration of impurities, onto the drift layer 3 that is now provided with the gate insulating film 7, through CVD or other methods. When a polysilicon layer is formed through CVD, polysilicon grows not only in a vertical direction from the bottom surface of each gate trench 6, but also in a horizontal direction from the side surfaces of each gate trench 6. The inside of the gate trench 6 is thus filled with polysilicon relatively easily.

Subsequently, the polysilicon layer on the drift layer 3 is removed through etching. The polysilicon layer on the surface of the drift layer 3 is removed through etching, but the polysilicon layer inside each gate trench 6 remains because it is thick, thus forming the gate electrodes 8.

Removing the polysilicon layer on the surface of the drift layer 3 completely within the wafer surface requires not a little over-etching. Hence, when the polysilicon layer on the surface of the drift layer 3 is entirely etched, the upper surface of the gate electrode 8 inside the gate trench 6 is formed in a location retracted from the opening end of the gate trench 6.

Figure 13:
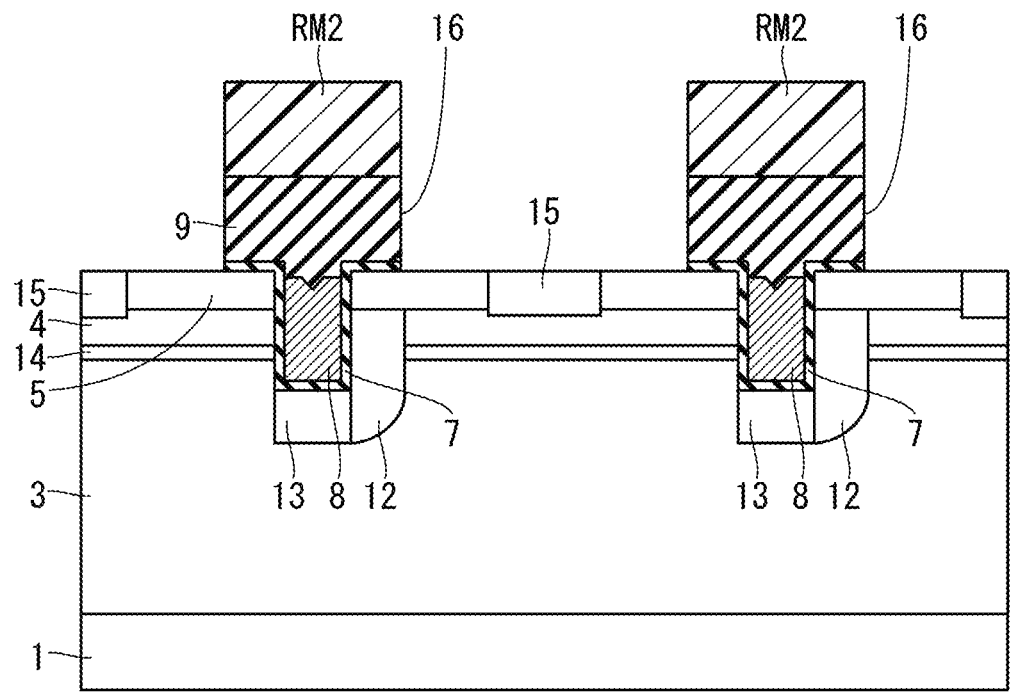
FIG. 13 is a cross-sectional view showing a process step for manufacturing the semiconductor device according to the first embodiment of the present invention.
Figure 14:
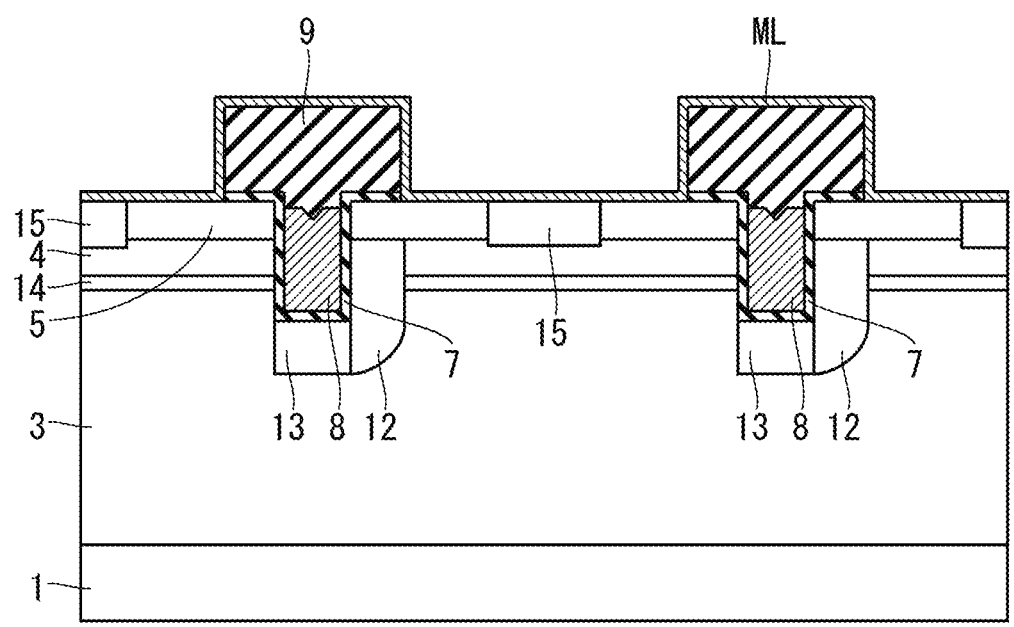
FIG. 14 is a cross-sectional view showing a process step for manufacturing the semiconductor device according to the first embodiment of the present invention.

The next step (c.f., FIG. 12) is forming the interlayer insulating film 9 to cover the termination region 32 (c.f., FIG. 1) and active region 30, followed by patterning, onto the interlayer insulating film 9 using a resist material, an etching mask RM2 having openings OP2 at locations corresponding to regions for forming the source contacts 16. The etching mask RM2 needs to be formed with reference to the aforementioned alignment mark. Then, the interlayer insulating film 9 undergoes dry etching or other methods via the etching mask RM2 to form the source contacts 16 penetrating the interlayer insulating film 9 to reach a location above the drift layer 3, as shown in FIG. 13. At this time, the gate insulating film 7, which is no longer necessary, is removed together with the interlayer insulating film 9.

It is noted that the etching mask RM2 may have an opening for forming a gate contact (not shown) that is formed in the termination region 32 (c.f., FIG. 1), and that dry etching or other methods may be performed via this opening to remove the interlayer insulating film 9 and simultaneously form the gate contact. As a matter of course, the source contacts 16 and the gate contact may be formed in separate process steps.

The next step (c.f., FIG. 14) is forming a metal film ML (e.g., nickel film) over the source contacts 16 and interlayer insulating film 9 through sputtering or other methods. The subsequent step is annealing at a temperature ranging from 300 to 1200° C. to form, as shown in FIG. 15, a metal silicide film (i.e., a $NiSi_2$ film herein) in the upper parts of the source regions 5 and well contact regions 15 exposed to the bottom surfaces of the source contacts 16. This metal silicide film is the silicide film 17.

The subsequent step is forming the source electrode 10 to fill the source contacts 16, through sputtering or other methods, and electrically connecting the source electrode 10 to the well contact regions 15 and source region 5. This provides the cross-sectional configurations shown in FIGS. 3 and 4. The gate pad, or wires for connection to the gate pad is formed from the inside to upper part of a gate contact not shown.

The final step is forming the drain electrode 11 onto the other main surface of the silicon-carbide semiconductor substrate 1 through sputtering or other methods. Through these process steps, the trench-gate MOSFET 100 illustrated in FIGS. 2 to 3 is manufactured.

<Features>

The following describes features of the trench-gate MOSFET 100. As illustrated in FIGS. 3 and 4, the trench-bottom-surface field-reducing regions 13 are disposed under the respective gate trenches 6. Consequently, depletion layers extending from the trench-bottom-surface field-reducing regions 13 enable considerable reduction of an electric field that is applied to the gate insulating film 7 when the MOSFET is in OFF state.

As shown in FIG. 3, the sidewall well connection layers 12 are each in contact with one of the side surfaces of the corresponding trench-bottom-surface field-reducing region 13 as well as the well region 4. The trench-bottom-surface field-reducing region 13 is thus electrically connected to the well region 4. This electrical connection allocates a current path for charge and discharge at a pn junction that is formed by the trench-bottom-surface field-reducing region 13 and drift layer 3 during the switching operations of the MOSFET. Switching loss is consequently reduced. In other words, the sidewall well connection layers 12 each allocate a current path of a displacement current that flows along with the elongation and contraction of the depletion layer formed at the pn junction. The trench-bottom-surface field-reducing regions 13 each establish a floating potential when the sidewall well connection layer 12 is not provided. This lowers potential follow in the trench-bottom-surface field-reducing region 13 with respect to the ON and OFF operations of the MOSFET. The response speed of the depletion layer formed at the pn junction consequently slows, thus producing a structure in which the MOSFET is less likely to be turned on and off. Switching loss consequently increases. Proving the sidewall well connection layers 12 enhances the response speed of the depletion layers formed at the pn junctions, thereby reducing switching loss.

The sidewall well connection layer 12, which is disposed in only part of the trench sidewall, causes no considerable reduction in the channel density. This prevents increase in the ON-resistance resulting from the provision of the sidewall well connection layer 12. In addition, the trench sidewall where the sidewall well connection layer 12 is not disposed, extends in a direction parallel to an off-direction. This achieves uniform channel characteristics, thus preventing current concentration in a particular channel surface and causing no instability in a threshold voltage, thereby achieving a MOSFET that operates in a highly stable manner.

The sidewall well connection layer 12, which is disposed on only one of the sidewalls of each gate trench 6, considerably prevents increase in the ON-resistance resulting from the provision of the sidewall well connection layer 12.

The sidewall well connection layers 12 that are, in plan view, adjacent to each other in a direction where the gate trenches 6 extend, are desirably arranged at intervals as large as or larger than an interval at which the gate trenches 6 are arranged. Arranging the sidewall well connection layers 12 at such intervals further prevents decrease in the channel density, and highly prevents increase in the ON-resistance resulting from the provision of the sidewall well connection layers 12.

The sidewall well connection layers 12 are each provided to extend from the sidewall of the corresponding gate trench 6, in a direction (i.e., second direction, which is the lateral direction of FIG. 3) perpendicular to a direction (i.e., first direction, which is the lateral direction of FIG. 2) in which the gate trenches 6 extend. The sidewall well connection layer 12 is shorter in the second direction than the length between the gate trenches adjacent to each other. In addition, the sidewall well connection layer 12 does not block the space between the adjacent gate trenches. Consequently, a current flows through the drift layer 3 between the sidewall well connection layers 12 adjacent to each other in the direction where the gate trenches 6 extend, and thus spreads in the drift layer 3. This current flow and diffusion prevents increase in the ON-resistance resulting from the provision of the sidewall well connection layers 12.

Each sidewall well connection layer 12 is configured in such a manner that its depth (i.e., length in the thickness direction of the drift layer) decreases along with distance in the second direction from the sidewall of the gate trench 6. Such a configuration facilitates current diffusion, thereby further preventing increase in the ON-resistance.

<First Modification>

Figure 16:
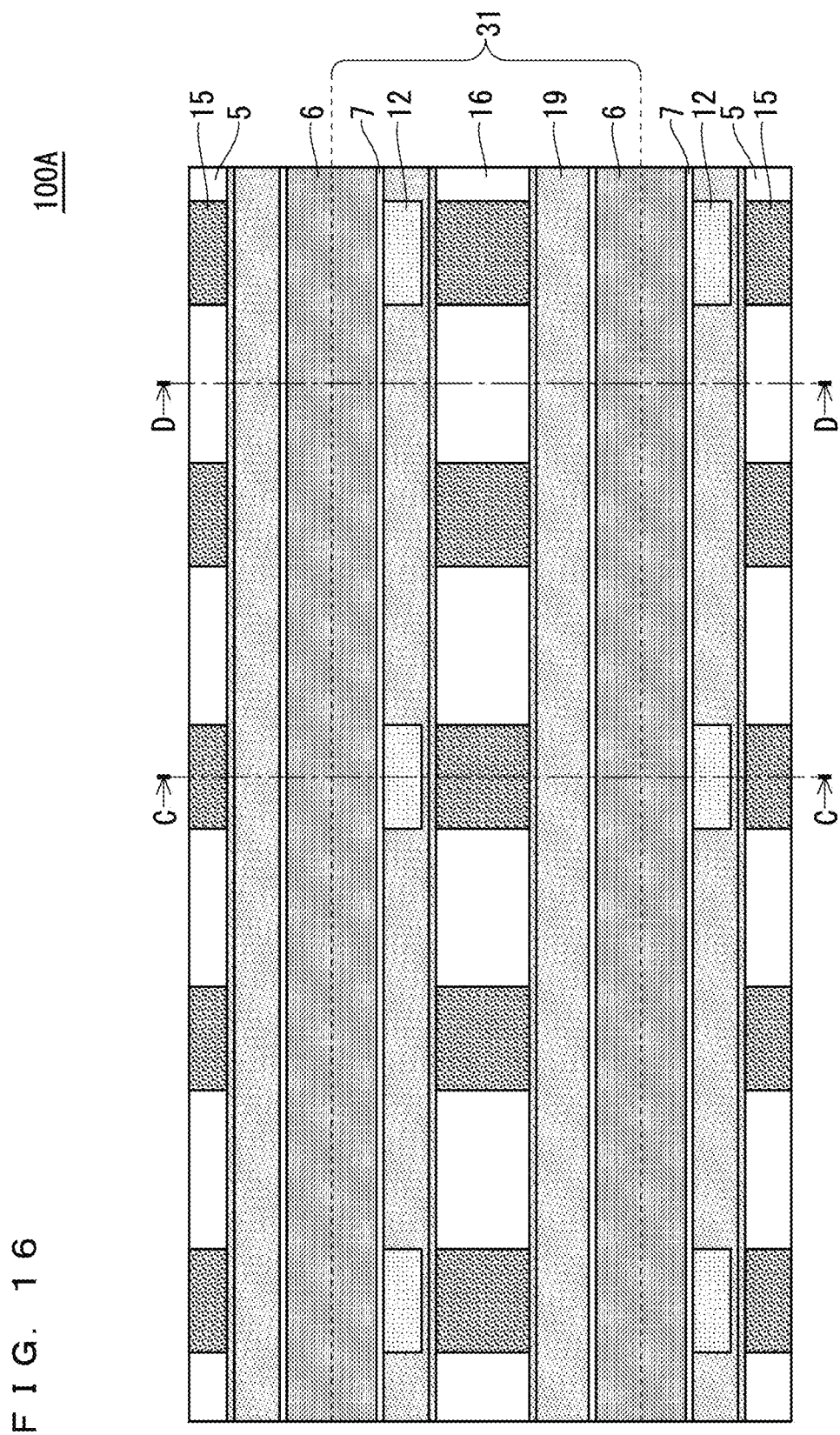
FIG. 16 is a plan view showing the configuration of a semiconductor device according to a modification of the first embodiment of the present invention.
Figure 17:
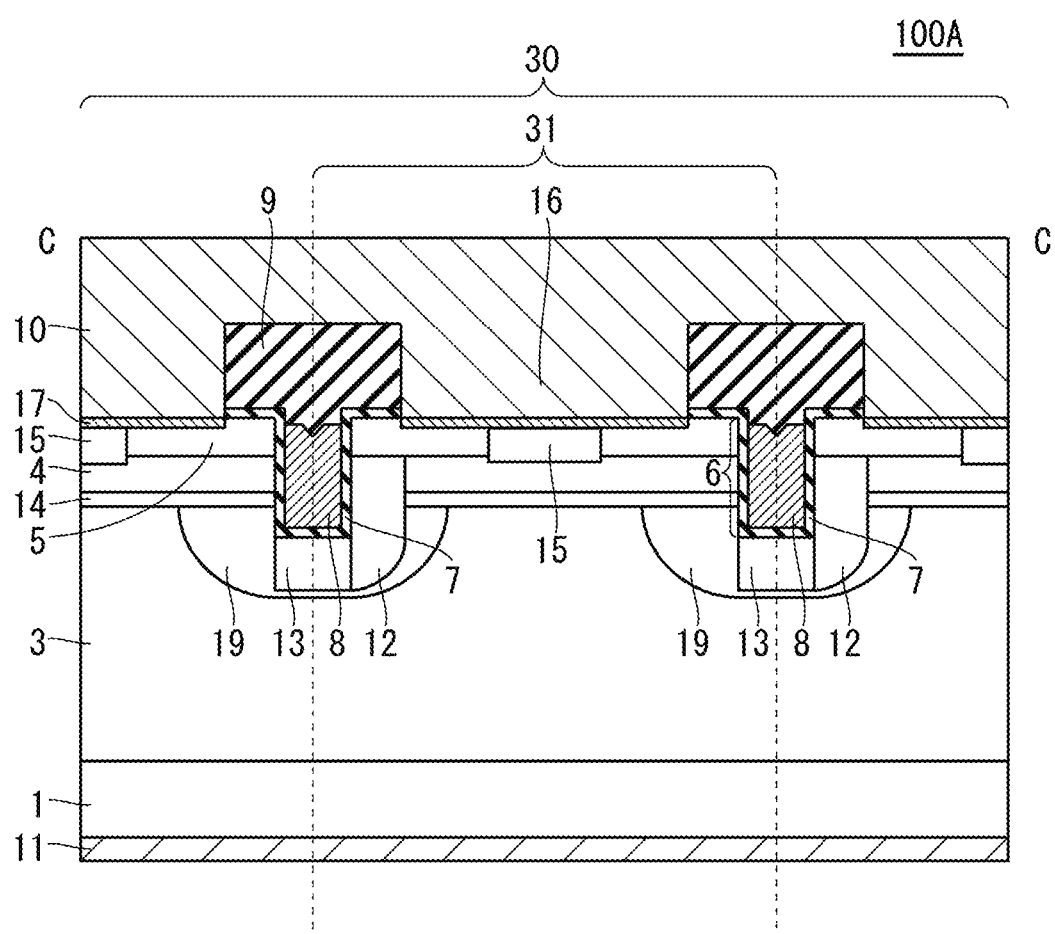
FIG. 17 is a cross-sectional view showing the configuration of the semiconductor device according to the modification of the first embodiment of the present invention.

The following describes the configuration of a trench-gate MOSFET 100A according to a modification of the first embodiment of the present invention, with reference to FIGS. 16 and 18. FIGS. 16 to 18 correspond to FIGS. 2 to 4. Components identical to those shown in FIGS. 2 to 4 are denoted by the same signs and will not be elaborated upon. FIG. 17 is a cross-sectional view taken along line C-C denoted by arrows in FIG. 16. FIG. 18 is a cross-sectional view taken along line D-D denoted by arrows in FIG. 16.

As shown in FIGS. 16 to 18, the trench-gate MOSFET 100A includes current spreading regions 19 of n-type each of which is adjacent to the corresponding sidewall well connection layer 12 and trench-bottom-surface field-reducing region 13, and is provided to surround the corresponding sidewall well connection layer 12 and trench-bottom-surface field-reducing region 13.

As shown in FIG. 18, the current spreading region 19 in a location without the sidewall well connection layer 12 is disposed in the drift layer 3 in such a manner that the perimeter of the current spreading region 19 extends beyond both side surfaces and lower surface of the trench-bottom-surface field-reducing region 13. As shown in FIG. 17, the current spreading region 19 in a location provided with the sidewall well connection layer 12 is disposed in the drift layer 3 in such a manner that the perimeter of the current spreading region 19 extends beyond one of the side surfaces and lower surface of the trench-bottom-surface field-reducing region 13, and beyond a side surface of the sidewall well connection layer 12 and the lower surface of the sidewall well connection layer 12.

As shown in FIG. 16, the current spreading regions 19 are each disposed along the entire corresponding gate trench 6 that extends. The current spreading regions 19 can be formed using the etching mask RM1 having the openings OP1 in locations corresponding to regions for forming the gate trenches 6.

Figure 9:
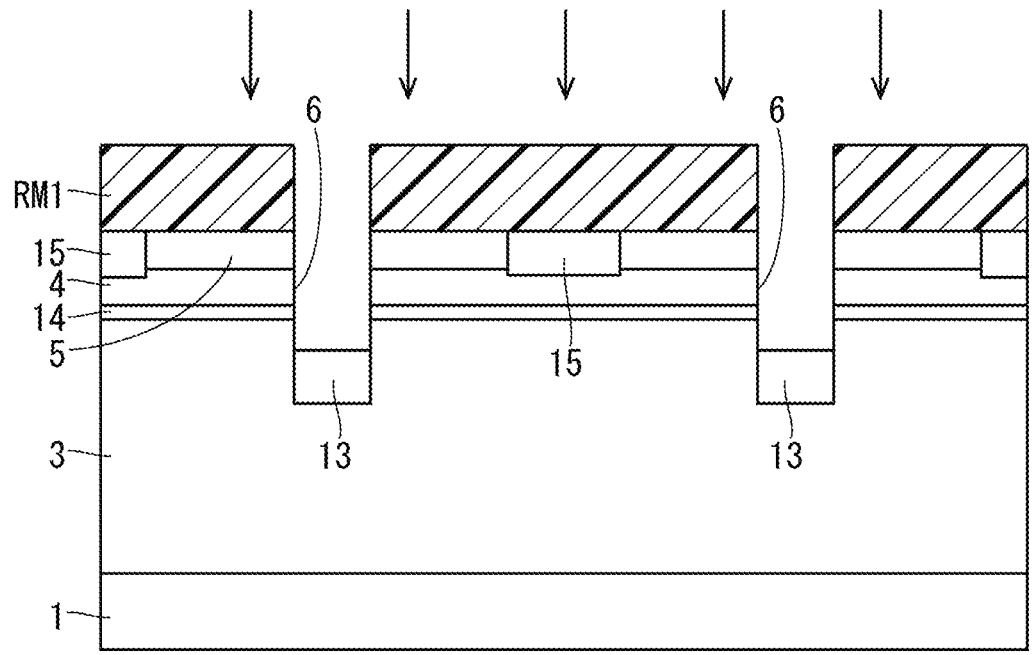
FIG. 9 is a cross-sectional view showing a process step for manufacturing the semiconductor device according to the first embodiment of the present invention.
Figure 10:
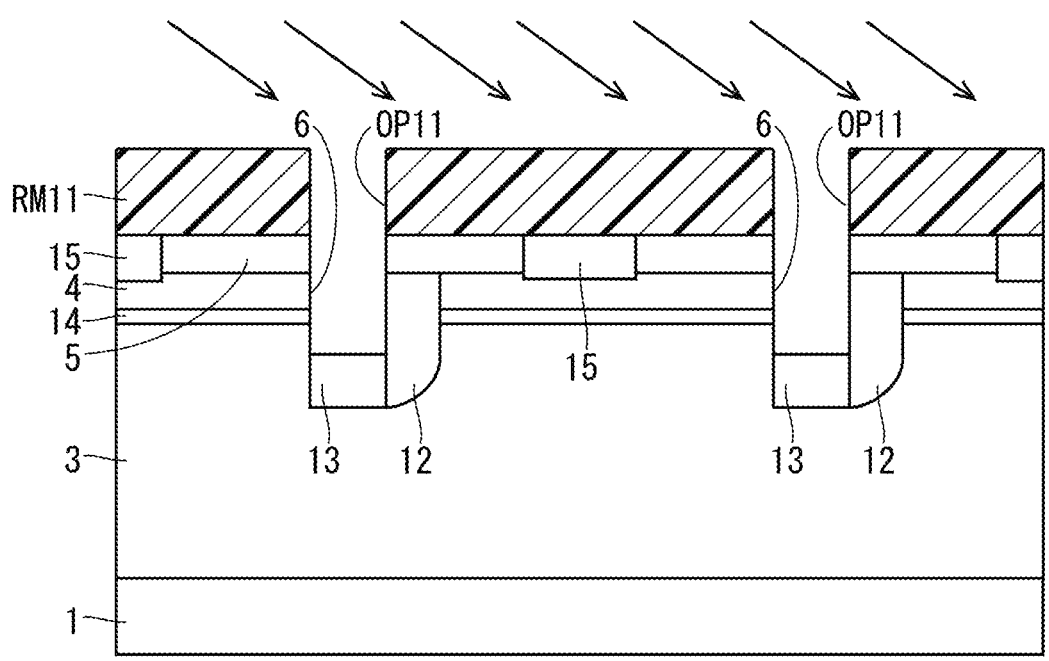
FIG. 10 is a cross-sectional view showing a process step for manufacturing the semiconductor device according to the first embodiment of the present invention.
Figure 11:
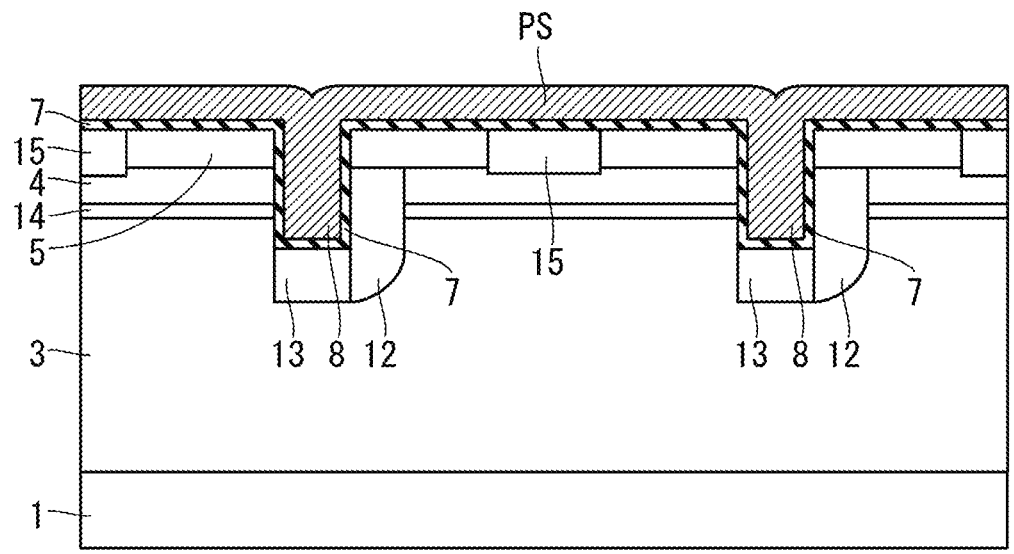
FIG. 11 is a cross-sectional view showing a process step for manufacturing the semiconductor device according to the first embodiment of the present invention.
Figure 12:
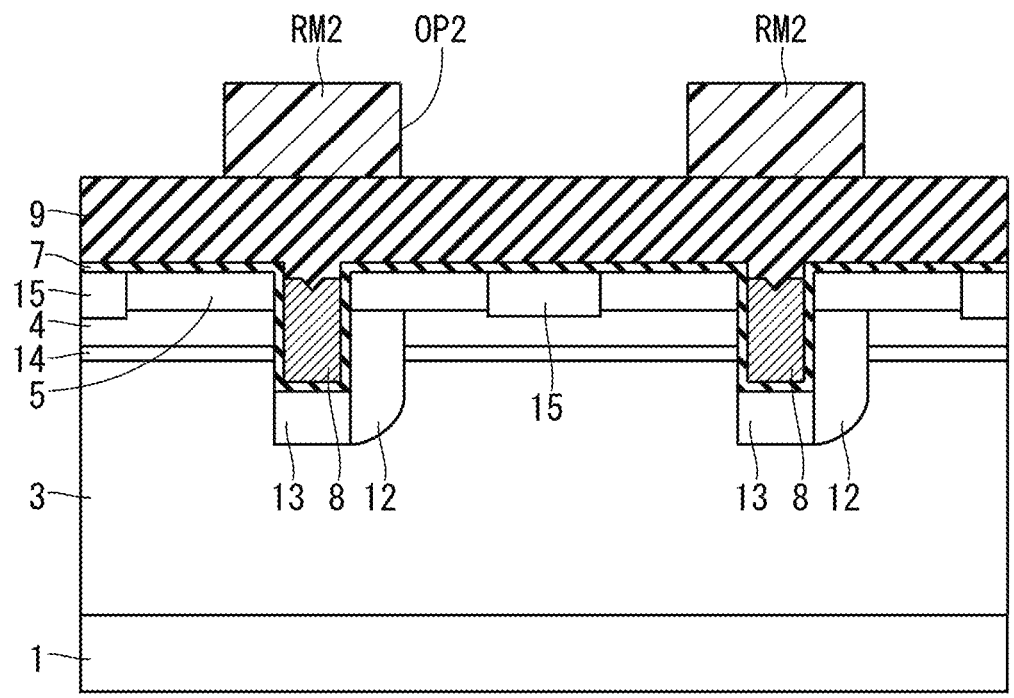
FIG. 12 is a cross-sectional view showing a process step for manufacturing the semiconductor device according to the first embodiment of the present invention.
Figure 19:
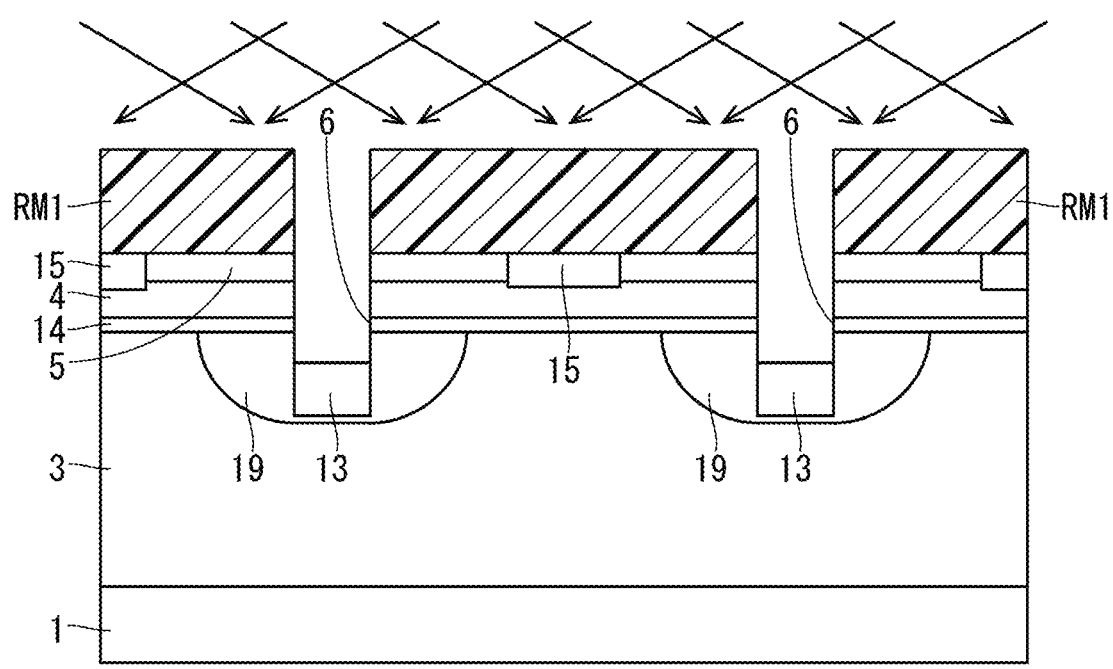
FIG. 19 is a cross-sectional view showing a process step for manufacturing the semiconductor device according to the modification of the first embodiment of the present invention.

In other words, the current spreading region 19 is formed in the drift layer 3 so as to have a perimeter extending beyond both side surfaces and lower surface of the trench-bottom-surface field-reducing region 13, through the following process steps: forming the p-type trench-bottom-surface field-reducing region 13 under the bottom surface of the gate trench 6 in the process step shown in FIG. 9, followed by, as shown in FIG. 19, injecting n-type impurity ions from oblique directions (such injection is called oblique ion implantation) by the use of the etching mask RM1 as an ion-implantation mask. In the ion injection for forming the current spreading region 19, the silicon-carbide semiconductor substrate 1 in the form of a wafer is tilted. This ion implantation is performed on both sidewalls of the gate trench 6 under the following condition: an incident angle ranging from 20 to 60 degrees with respect to implantation at 0 degrees, which is an implantation method of injecting impurities in a direction perpendicular to the wafer. This ion implantation is performed under the following condition as well: an impurity concentration of $5 \times 10^{15}$ cm$^{-3}$ or more and $1 \times 10^{18}$ cm$^{-3}$ or less. Although the etching mask RM1 is used herein by way of example, the entire wafer surface may undergo ion implantation after the etching mask RM1 is removed.

As earlier described, the impurity concentration of the drift layer 3 is $1 \times 10^{14}$ cm$^{-3}$ or more and $1 \times 10^{17}$ cm$^{-3}$ or less. The current spreading regions 19 are formed to have a higher impurity concentration than the drift layer 3 within the aforementioned impurity concentration range.

After the current spreading regions 19 are formed, the sidewall well connection layers 12 are formed each of which is in contact with one of the sidewalls of the corresponding gate trench 6 and one of the side surfaces of the corresponding trench-bottom-surface field-reducing region 13. As earlier described with reference to FIG. 10, the sidewall well connection layers 12 are formed using an ion-implantation mask that has a pattern provided with the openings OP11 in only portions including the sidewalls of the gate trenches 6 where the sidewall well connection layers 12 are to be formed, and has no openings in portions including the sidewalls of the gate trenches 6 where the sidewall well connection layers 12 are to be not formed.

Providing the current spreading regions 19 having a higher impurity concentration than the drift layer 3 produces higher resistance in a region of the drift layer 3 that is not provided with the current spreading regions 19 than the current spreading regions 19, thus allowing a current to flow through the lower-resistance current spreading regions 19 on a priority basis, thereby reducing the ON-resistance of the MOSFET. In providing the current spreading regions 19, the highly doped layer 14 may or may not be formed.

It is noted that although FIGS. 16 to 18 illustrate, by way of example, that the perimeter of the current spreading region 19 is provided to extend beyond both side surfaces of the trench-bottom-surface field-reducing region 13, the perimeter of the current spreading region 19 may be provided to extend beyond only one of the side surfaces of the trench-bottom-surface field-reducing region 13.

<Second Modification>

Figure 20:
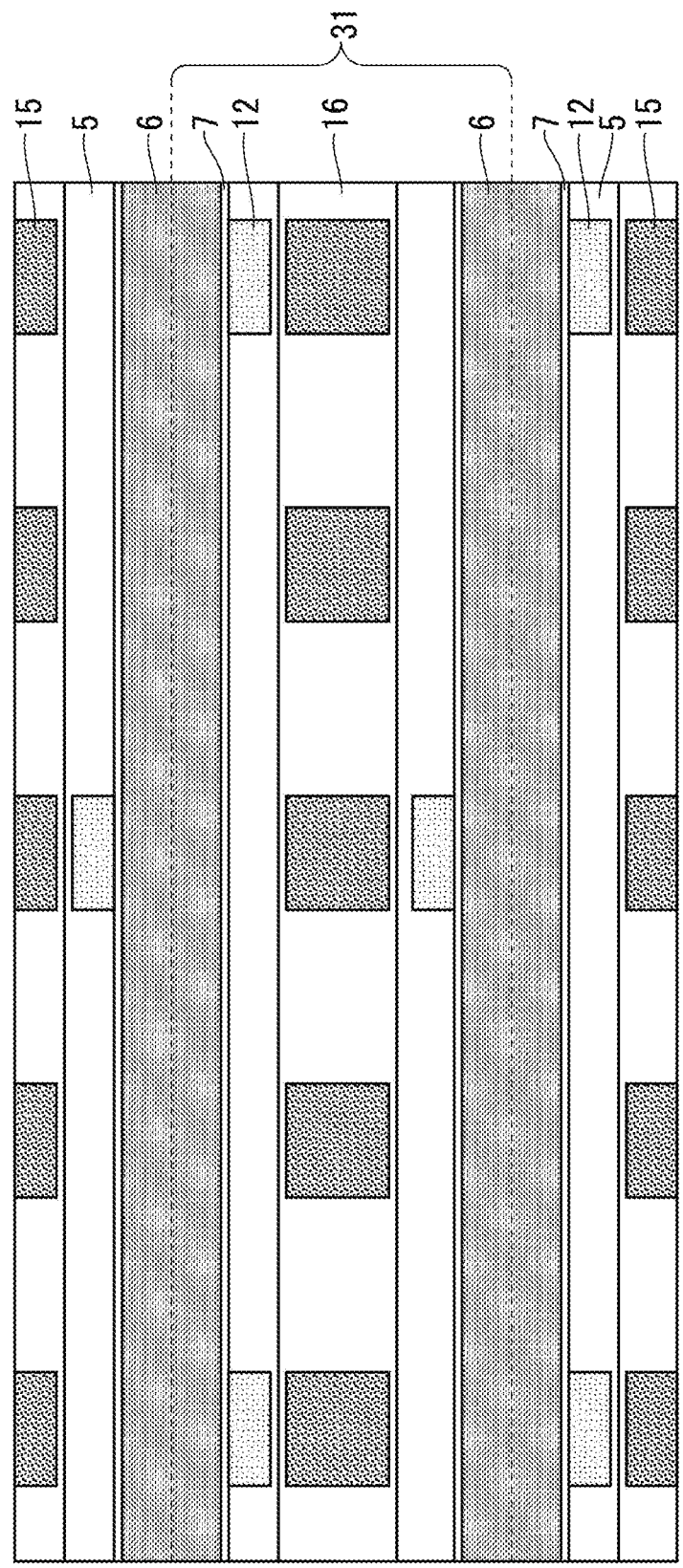
FIG. 20 is a plan view showing the configuration of a semiconductor device according to a modification of the first embodiment of the present invention.

Referring to FIG. 2, which shows the configuration of the trench-gate MOSFET 100 in plan view according to the first embodiment, the foregoing has illustrated that the sidewall well connection layers 12 are disposed only one of the sidewalls of the gate trench 6. In one embodiment, the sidewall well connection layers 12 may be disposed alternately on both sidewalls of the gate trench 6, as seen in a trench-gate MOSFET 100B shown in FIG. 20. With such a configuration, channel surfaces on both sidewalls of the gate trench 6 are the same in area. In addition, the balance of currents flowing through the channels improves when compared with a configuration in which the sidewall well connection layers 12 are disposed on only one of the sidewalls of the gate trench 6.

Figure 21:
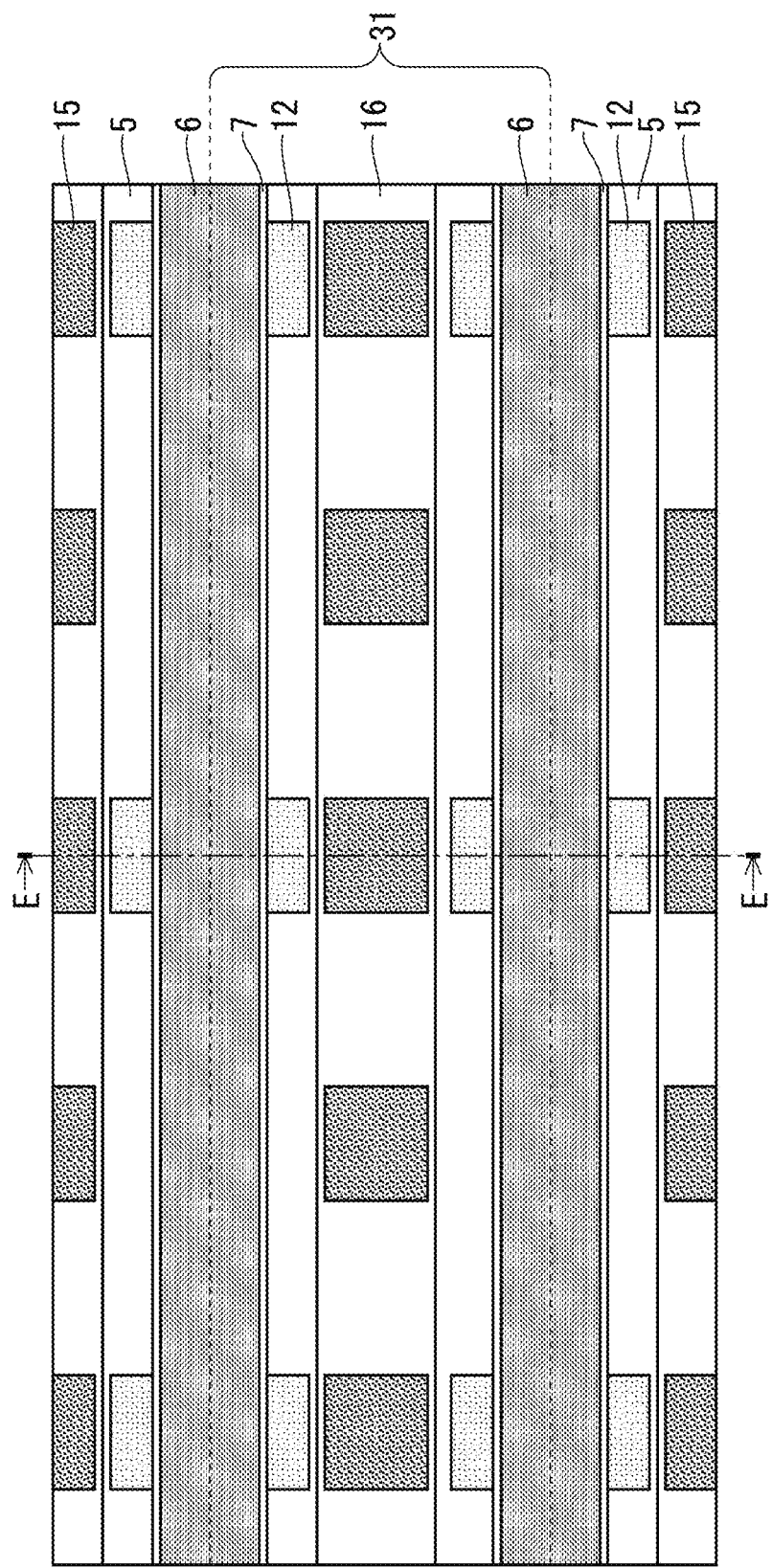
FIG. 21 is a plan view showing the configuration of a semiconductor device according to a modification of the first embodiment of the present invention.
Figure 22:
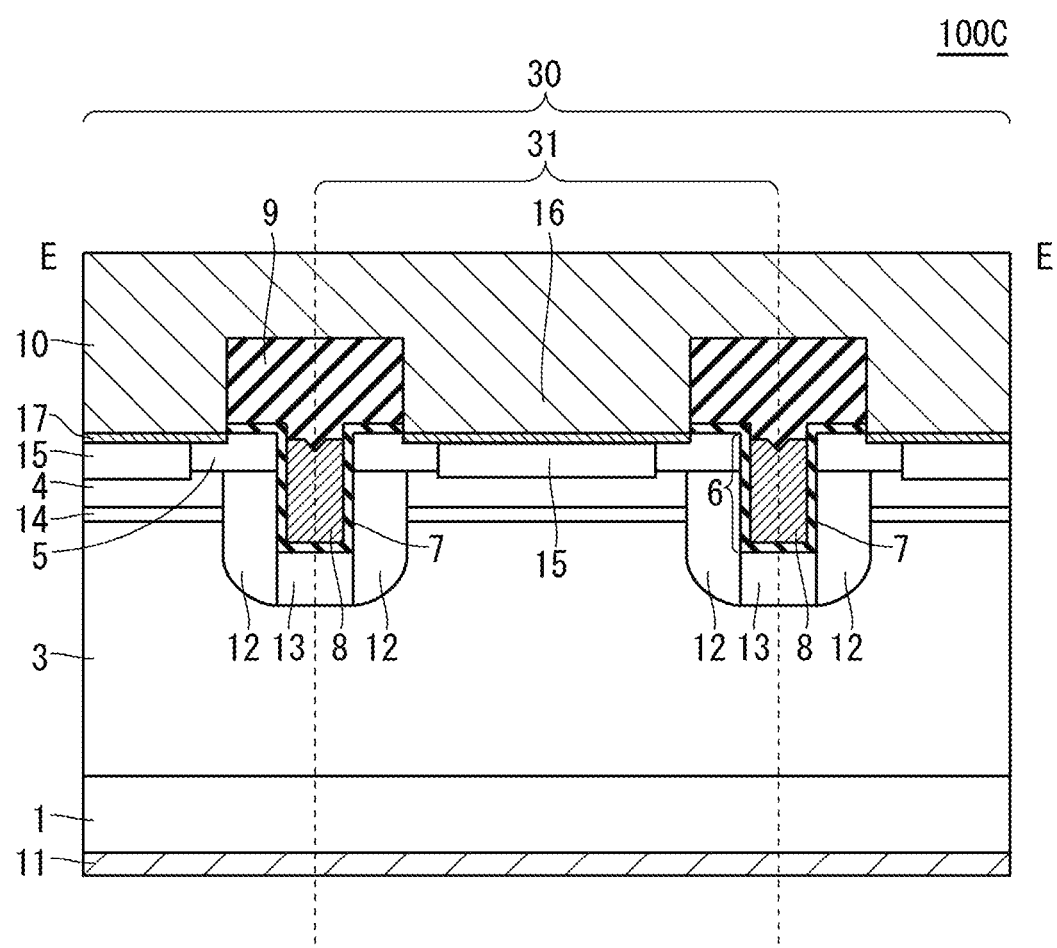
FIG. 22 is a plan view showing the configuration of the semiconductor device according to the modification of the first embodiment of the present invention.

In another embodiment, the sidewall well connection layers 12 may be disposed on both sidewalls of the gate trench 6, as seen in a trench-gate MOSFET 100C shown in FIG. 21. FIG. 22 is a cross-sectional view taken along line E-E denoted by arrows in FIG. 21. Forming the sidewall well connection layers 12 on both sidewalls of the gate trench 6 in this way doubles the number of the sidewall well connection layers 12. Such a configuration provides a wider current path for charge and discharge at a pn junction that is formed by the trench-bottom-surface field-reducing region 13 and drift layer 3 when the MOSFET switches. Switching loss is consequently reduced with more certainty. The channel surfaces on both sidewalls of the gate trench 6 are the same in area. In addition, the balance of the currents flowing through the channels improves when compared with a configuration in which the sidewall well connection layers 12 are disposed on only one of the sidewalls of the gate trench 6. At this time, the sidewall well connection layers 12 on both sidewalls of the gate trench 6 may or may not have the same concentration.

It is noted that the arrangement of the sidewall well connection layers 12 may take any pattern unless it interferes with the operation of the MOSFET.

<Third Modification>

Referring to FIG. 2, which shows the configuration of the trench-gate MOSFET 100 in plan view according to the first embodiment, the foregoing has illustrated, by way of example only, that each unit cell 31 in the active region 30 is in the form of a continuous stripe in plan view. In one embodiment, the gate trenches 6 may be in the form of a lattice in plan view, or in the form of a ladder or T-shape in which the gate trenches 6 adjacent to each other are partly coupled together. In addition, each gate trench 6 may partly have a polygonal or wavy shape.

<Fourth Modification>

The first embodiment has described that the drift layer 3 has a main surface that is a (0001) plane having an off-angle θ at which the (0001) plane is inclined in a [11-20]-axis direction. The main surface of the drift layer 3 may be a (000-1) plane having an off-angle θ at which the (000-1) plane is inclined in the [11-20]-axis direction. Such a configuration also achieves a trench-gate MOSFET that brings a similar effect. It is needless to say that the surface of the drift layer 3 may be a (1-100) or (03-38) plane.

<Fifth Modification>

The first embodiment has described a configuration in which the sidewall well connection layer 12 is disposed on the sidewall of each gate trench 6 with a stripe shape extending in a direction parallel with an off-direction. The sidewall well connection layer 12 may be disposed on the sidewall of each gate trench 6 with a stripe shape extending in a direction perpendicular to the off-direction. Such a configuration, as well, reduces ON-resistance without considerably lowering channel density.

<Sixth Modification>

The first embodiment has described, by way of example, forming the sidewall well connection layers 12 through oblique ion implantation. The trench-bottom-surface field-reducing regions 13 each may have a distribution of concentration including reflected ions that are added when the trench sidewall undergoes oblique ion implantation. In other words, the trench sidewall undergoes oblique ion implantation, whereby ions reflected from the trench sidewall are injected into the trench bottom surface as well; consequently, p-type impurities are added to the trench-bottom-surface field-reducing region 13. The amount of ions reflected from the trench sidewall ranges from several percent to 10 percent with respect to the amount of ions injected into the trench sidewall through oblique ion implantation. In addition, the trench-bottom-surface field-reducing region 13 at this time has an impurity concentration that becomes higher along with approach to the sidewall well connection layer 12. This is because the amount of ions reflected from the trench sidewall increases along with approach to the trench sidewall. Part of the impurity concentration of the trench-bottom-surface field-reducing region 13 is high, whereby there is a sufficient current path for charge and discharge at a lower-resistance pn junction. Switching loss is consequently reduced.

Second Embodiment

The following describes a trench-gate MOSFET 200 according to a second embodiment of the present invention with reference to FIGS. 23 to 25. FIGS. 23 to 25 correspond to FIGS. 2 to 4. Components identical to those shown in FIGS. 2 to 4 are denoted by the same signs and will not be elaborated upon. FIG. 24 is a cross-sectional view taken along line F-F denoted by arrows in FIG. 23. FIG. 25 is a cross-sectional view taken along line G-G denoted by arrows in FIG. 23.

As shown in FIG. 23, the trench-gate MOSFET 200 in the second embodiment is configured such that each sidewall well connection layer 12 is provided to be connected to its adjacent well contact region 15.

In other words, as shown in FIG. 24, the sidewall well connection layer 12 provided to be in contact with a side surface of the trench-bottom-surface field-reducing region 13 and part of a sidewall of the gate trench 6, is also provided to be in contact with the well region 4 and the well contact region 15.

The sidewall well connection layer 12, which is in contact with the low-resistance well contact region 15, reduces the resistance of a current path through which a displacement current flows from a pn junction that is formed by the trench-bottom-surface field-reducing region 13 and drift layer 3 when the MOSFET switches, when compared with the sidewall well connection layer 12 that is in contact with only the well region 4. This allows the MOSFET to switch more rapidly and achieve less switching loss.

The first embodiment has described that the well region 4 is formed to have an impurity concentration of $1\times10^{16}$ cm$^{-3}$ or more and $3\times10^{19}$ cm$^{-3}$ or less, and that the sidewall well connection layer 12 is formed to have an impurity concentration of $5\times10^{16}$ cm$^{-3}$ or more and $1\times10^{20}$ cm$^{-3}$ or less. The sidewall well connection layer 12 is formed to have an impurity concentration higher than that of the well region 4 within the aforementioned range of impurity concentration, e.g., a range of $1\times10^{17}$ cm$^{-3}$ or more and $5\times10^{19}$ cm$^{-3}$ or less. Accordingly, the sidewall well connection layer 12 can be considered to be in contact with the well contact region 15.

<First Modification>

The sidewall well connection layers 12 each do not necessarily have to be connected to a single well contact region 15. The sidewall well connection layers 12 each may be connected to a plurality of well contact regions 15.

Figure 26:
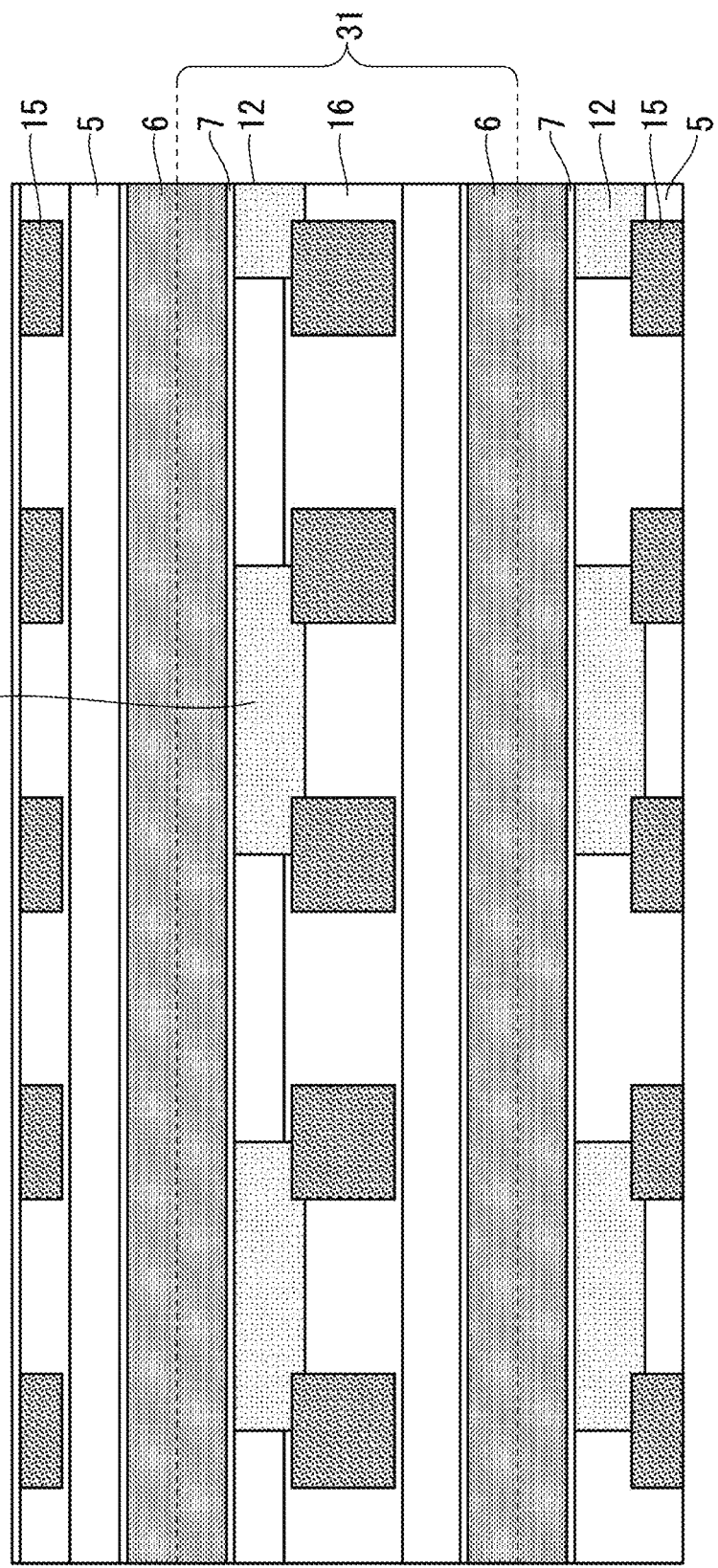
FIG. 26 is a plan view showing the configuration of a semiconductor device according to a modification of the second embodiment of the present invention.

In other words, as seen in a trench-gate MOSFET 200A shown in FIG. 26, each sidewall well connection layer 12 may be provided to extend from one of two well contact regions 15 adjacent to each other in a direction where the gate trench 6 extends, to the other, and may be connected to these two well contact regions 15.

Increase in the number of the well contact regions 15 to be connected, equates with increase in the current path of a displacement current flowing from a pn junction formed by the trench-bottom-surface field-reducing region 13 and drift layer 3. Consequently, path resistance lowers, thus further reducing switching loss.

<Second Modification>

The sidewall well connection layers 12 each may have a dual-layer structure. In other words, as seen in a trench-gate MOSFET 200B shown in FIG. 27, each sidewall well connection layer 12 has a dual-layer structure consisting of a first sidewall well layer 12a of p-type (i.e., first connection layer) and a second sidewall well layer 12b of p-type (i.e., second connection layer). The first sidewall well layer 12a is in contact with the gate trench 6 and has a high impurity concentration. The second sidewall well layer 12b is disposed outside the first sidewall well layer 12a and has a lower impurity concentration than the first sidewall well layer 12a. Part of the first sidewall well layer 12a is in contact with the source region 5. In addition, part of the second sidewall well layer 12b is in contact with the well contact region 15.

As described above, the first sidewall well layer 12a of the sidewall well connection layer 12 has a high impurity concentration. This allocates a current path for charge and discharge at a lower-resistance pn junction, thereby reducing switching loss. Further, the second sidewall well layer 12b has a lower impurity concentration. This reduces an electric field that is applied to a pn junction between the sidewall well connection layer 12 and drift layer 3 when the MOSFET is turned off. Avalanche breakdown voltage consequently enhances. The impurity concentrations of the first sidewall well layer 12a and second sidewall well layer 12b are set individually to satisfy the aforementioned relationship in impurity concentration between these layers, within a range of $5 \times 10^{16}$ cm$^{-3}$ or more and $1 \times 10^{20}$ cm$^{-3}$ or less, more desirably, within a range of $1 \times 10^{17}$ cm$^{-3}$ or more and $5 \times 10^{19}$ cm$^{-3}$ or less.

The first sidewall well layer 12a and the second sidewall well layer 12b can be formed through oblique ion implantation, by changing the dose and injection energy of p-type impurities. In other words, injecting the p-type impurities through oblique ion implantation at high injection energy and low dose can form the second sidewall well layer 12b; in addition, injecting the p-type impurities through oblique ion implantation at low injection energy and high dose can form the first sidewall well layer 12a.

<Third Modification>

Each sidewall well connection layer 12 with a dual-layer structure is not limited to a structure consisting of two layers having the same conductivity type as shown in FIG. 27. The sidewall well connection layer 12 may have a structure consisting of two layers having conductivity types different from each other. In other words, as shown in FIG. 28, the sidewall well connection layer 12 has a dual-layer structure consisting of a first sidewall well layer 12c of n-type (i.e., first connection layer) and a second sidewall well layer 12d of p-type (i.e., second connection layer). The first sidewall well layer 12c is in contact with the gate trench 6 and has a high impurity concentration. The second sidewall well layer 12d is disposed outside the first sidewall well layer 12c and has a lower impurity concentration than the first sidewall well layer 12c. Part of the first sidewall well layer 12c is in contact with the source region 5. In addition, part of the second sidewall well layer 12d is in contact with the source region 5 and the well contact region 15.

As described above, the first sidewall well layer 12c of the sidewall well connection layer 12 has a high impurity concentration. This allocates a current path for charge and discharge at a lower-resistance pn junction.

The impurity concentrations of the first sidewall well layer 12c and second sidewall well connection layer 12d are set individually to satisfy the aforementioned relationship in impurity concentration between these layers, within a range of $5 \times 10^{16}$ cm$^{-3}$ or more and $1 \times 10^{20}$ cm$^{-3}$ or less, more desirably, within a range of $1 \times 10^{17}$ cm$^{-3}$ or more and $5 \times 10^{19}$ cm$^{-3}$ or less.

The first sidewall well layer 12c and the second sidewall well layer 12d are formed in the following manner: injecting p-type impurity ions through oblique ion implantation to form the second sidewall well layer 12d in the entire sidewall well connection layer 12, followed by injecting n-type impurity ions through oblique ion implantation at higher dose than the p-type impurity ions to form the first sidewall well layer 12c. The first sidewall well layer 12c is formed through oblique ion implantation, at an oblique injection angle smaller than that in the formation of the second sidewall well layer 12d, so as to be formed at a very shallow depth from a trench sidewall. Accordingly, the inclined first sidewall well layer 12c is formed also in the upper layer of the trench-bottom-surface field-reducing region 13.

Third Embodiment

Figure 29:
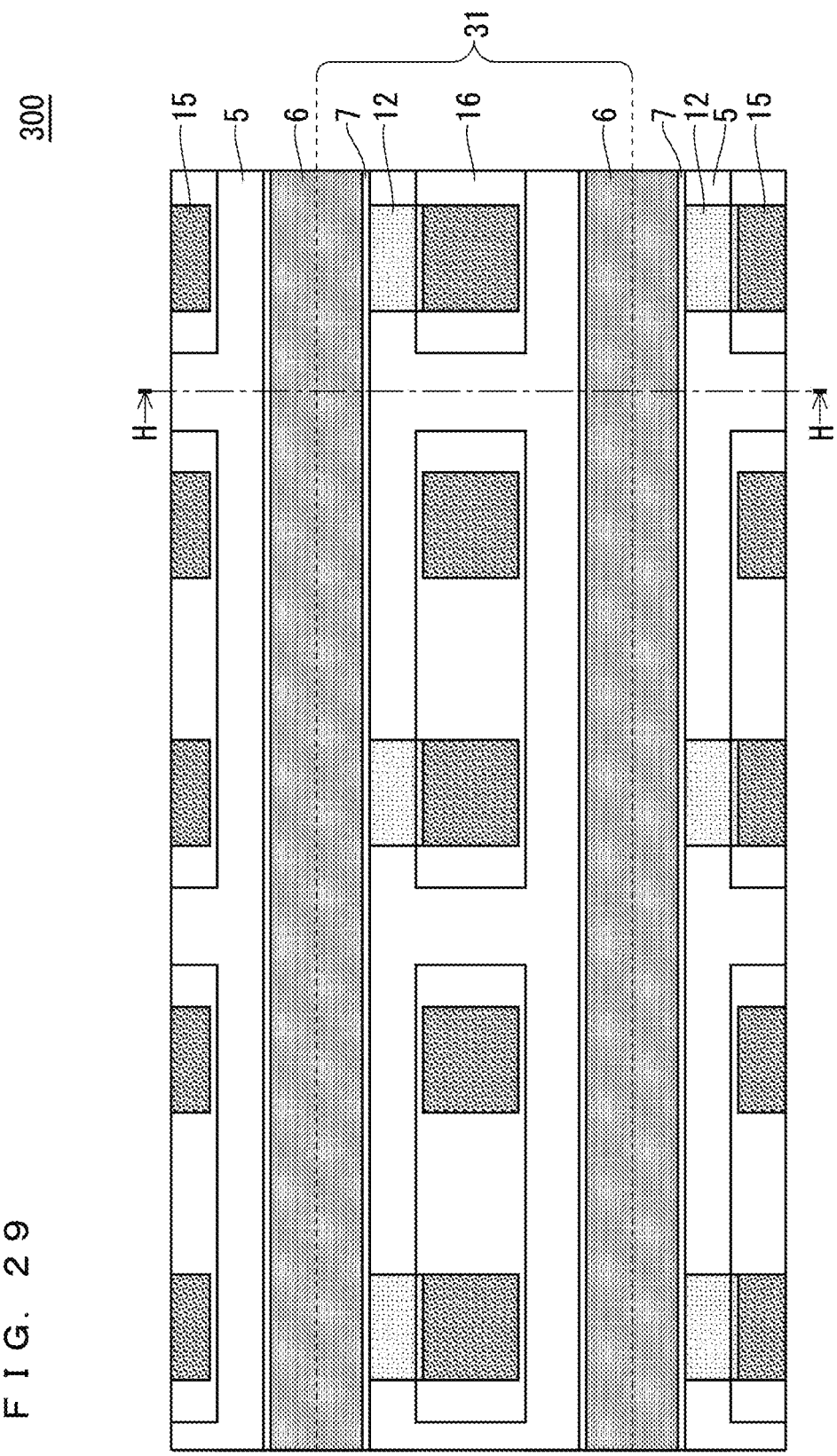
FIG. 29 is a plan view showing the configuration of a semiconductor device according to a third embodiment of the present invention.

The following describes a trench-gate MOSFET 300 according to a third embodiment of the present invention, with reference to FIGS. 29 and 30. FIGS. 29 and 30 correspond to FIGS. 23 and 25. Components identical to those shown in FIGS. 23 and 25 are denoted by the same signs and will not be elaborated upon. FIG. 30 is a cross-sectional view taken along line H-H denoted by arrows in FIG. 29.

As shown in FIG. 29, the trench-gate MOSFET 300 in the third embodiment is configured such that the opening of each source contact 16 has a stipe (i.e., rectangular) shape in plan view provided to include, in plan view, two well contact regions 15 adjacent to each other in a direction in which the gate trenches 6 extend.

As shown in FIG. 30, the trench-gate MOSFET 300 has a region without the source contact 16. The area ratio of this region in the active region 30 needs to be set to a degree such that the region does not interfere with the operation of the MOSFET. The openings of the source contacts 16 may have any shape in plan view as long as this condition is satisfied. The openings may be circles having a uniform diameter, quadrangles having a uniform width, or other shapes.

Fourth Embodiment

Figure 31:
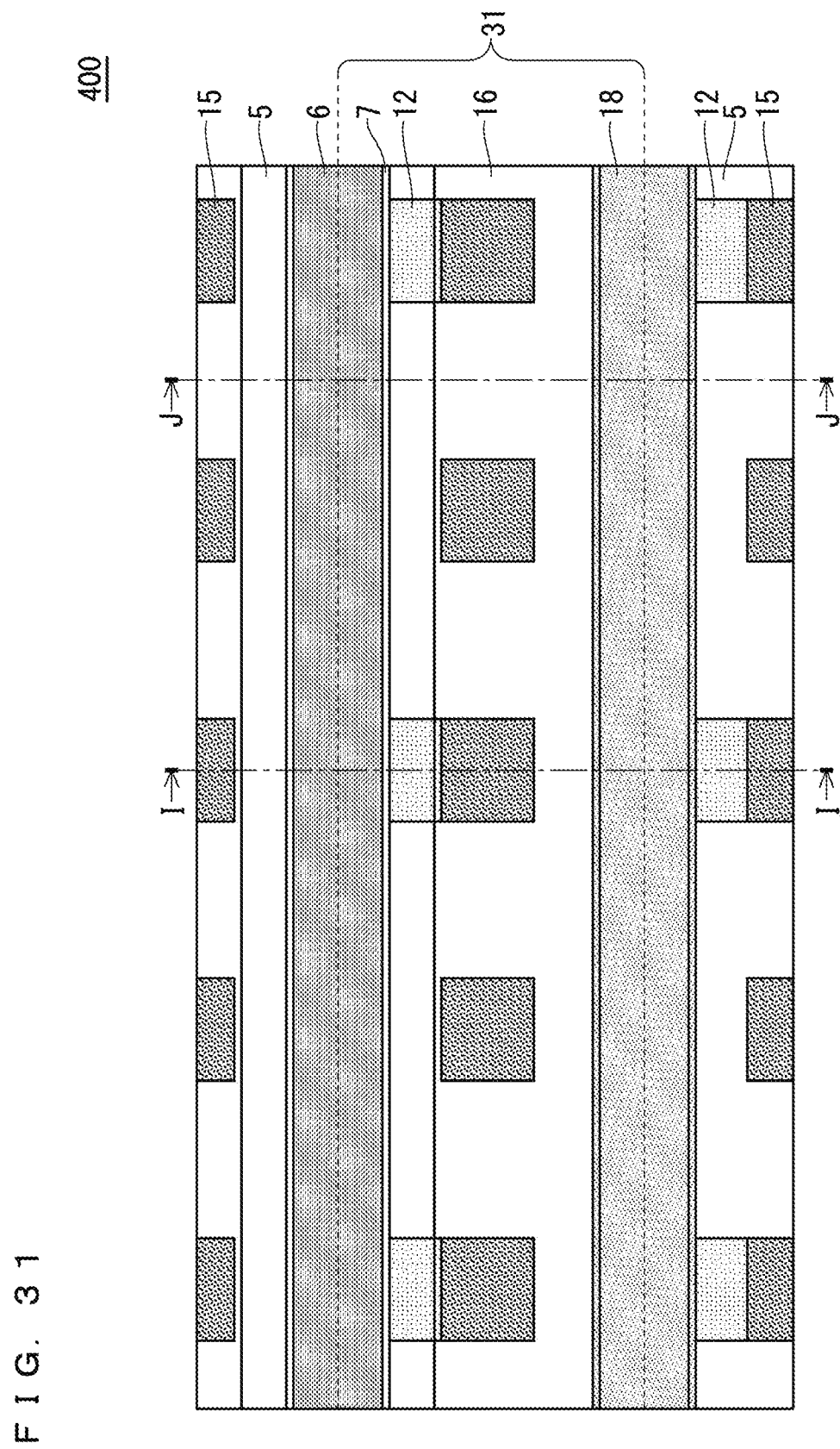
FIG. 31 is a plan view showing the configuration of a semiconductor device according to a fourth embodiment of the present invention.

The following describes a trench-gate MOSFET 400 according to a fourth embodiment of the present invention, with reference to FIGS. 31 to 33. FIGS. 31 to 33 correspond to FIGS. 23 to 25. Components identical to those shown in FIGS. 23 to 25 are denoted by the same signs and will not be elaborated upon. FIG. 32 is a cross-sectional view taken along line I-I denoted by arrows in FIG. 31. FIG. 33 is a cross-sectional view taken along line J-J denoted by arrows in FIG. 31.

As shown in FIG. 32, the trench-gate MOSFET 400 in the fourth embodiment is configured such that some of the gate trenches 6 do not include the gate insulating film 7 and gate electrode 8, and have their inner-wall surfaces covered with Schottky electrodes 18. Such a gate trench 6 that does not include the gate insulating film 7 and gate electrode 8 and have an inner-wall surface covered with the Schottky electrode 18 is referred to as a second gate trench. In addition, the gate trench 6 that includes the gate insulating film 7 and gate electrode 8 is referred to as a first gate trench.

As shown in FIG. 32, the Schottky electrode 18 is in contact with the trench-bottom-surface field-reducing region 13 at the bottom of the gate trench 6. The trench-bottom-surface field-reducing region 13 is connected to the source contact 16 via the sidewall well connection layer 12.

The gate trench 6 (i.e., second gate trench) whose inner-wall surface is covered with the Schottky electrode 18, is disposed at the bottom of the source contact 16 and includes the source electrode 10 filled in a region surrounded by the Schottky electrode 18. The Schottky electrode 18 can be provided by forming a material, such as Ti, Mo, or Ni, through sputtering.

When a large current (e.g., recovery current that flows during a recovery operation) flows through a pn diode formed by the well region 4 and trench-bottom-surface field-reducing region 13 and by the drift layer 3, to cause a silicon-carbide MOSFET to operate as a bipolar transistor, crystal defects in the drift layer 3 expand to possibly degrade the operational characteristics of the silicon-carbide MOSFET.

The trench-gate MOSFET 400 enables a recovery current to flow as a unipolar current via the Schottky electrode 18 without turning on a pn diode formed by the well region 4 and trench-bottom-surface field-reducing region 13 and by the drift layer 3. In other words, a return current flows from the source electrode 10 toward the drain electrode 11 when a low voltage is applied to the drain electrode 11 with respect to the source electrode 10, that is, when a reverse electromotive voltage is applied across the MOSFET. In this state, a forward electric field (i.e., forward bias) is applied at a Schottky junction formed at the contact between the trench-bottom-surface field-reducing region 13 and the Schottky electrode 18, thus allowing a unipolar current, which is an electronic current, to flow from the Schottky electrode 18 toward the trench-bottom-surface field-reducing region 13 as a recovery current. This prevents the expansion of the crystal defects and the degradation in the operational characteristics.

The MOSFET is in ON state under the application of a high voltage to the drain electrode 11 with respect to the source electrode 10 and under the application of a positive voltage not less than a threshold to the gate electrode 8. In the ON state, an inverting channel is formed in a channel region, and a path for electrons or carriers to flow is also formed in the channel region. On the other hand, no current flows through the Schottky junction at the contact between the Schottky electrode 18 and the trench-bottom-surface field-reducing region 13, because an electric field in a direction in which a current is less likely to flow, that is, an electric field in a reverse direction (i.e., reverse bias), is applied to the Schottky junction. Such a Schottky barrier diode, formed by the Schottky electrode 18 and the trench-bottom-surface field-reducing region 13, functions as a recovery diode (i.e., freewheeling diode).

The trench-bottom-surface field-reducing region 13 under the bottom surface of the gate trench 6 provided with the Schottky electrode 18, reduces an electric field that is applied to the Schottky electrode 18 when the MOSFET is turned off. In addition, the trench-bottom-surface field-reducing region 13, which is electrically connected to the well region 4 by the sidewall well connection layer 12, allocates a current path for charge and discharge at a pn junction that is formed by the trench-bottom-surface field-reducing region 13 and drift layer 3 during switching operations. This allows a depletion layer that is formed at the pn junction, to respond rapidly during the switching operations, thereby reducing switching loss.

The sidewall well connection layer 12, which is disposed on only part of the trench sidewall, allows the Schottky electrode, serving as a Schottky barrier diode, to have a sufficient density, while maintaining the density of a channel, serving as a MOSFET. This reduces a recovery current flowing through a single Schottky electrode 18 even in a recovery operation such as the switching of a large current. Consequently, degradation in the MOSFET is avoided.

<Modification>

This embodiment may provide the current spreading regions 19 of n-type each of which is adjacent to the sidewall well connection layer 12 and trench-bottom-surface field-reducing region 13 and is provided to cover at least the trench-bottom-surface field-reducing region 13, as earlier described with reference to FIGS. 16 to 18.

Providing the current spreading regions 19 further reduces ON-resistance and also reduces loss caused by recovery currents flowing through the Schottky electrodes 18.

Fifth Embodiment

The following describes a trench-gate MOSFET 500 according to a fifth embodiment of the present invention with reference to FIG. 34. FIG. 34 corresponds to FIG. 24. Components identical to those shown in FIG. 24 are denoted by the same signs and will not be elaborated upon. FIG. 34 is a cross-sectional view taken along line F-F denoted by arrows in FIG. 23.

As shown in FIG. 34, the trench-gate MOSFET 500 in the fifth embodiment includes the sidewall well connection layers 12 and trench-bottom-surface field-reducing regions 13 each of which is disposed deep in the drift layer 3 to reach the vicinity of one of the main surfaces of the silicon-carbide semiconductor substrate 1. Each sidewall well connection layer 12 and each trench-bottom-surface field-reducing region 13 form a p-type pillar (i.e., a pillar of second conductivity type), and the drift layer 3 between the p-type pillars adjacent to each other forms an n-type pillar (i.e., a pillar of first conductivity type), thus forming a super-junction structure.

Providing such a p-type pillar, which reaches deep in the drift layer 3 and is formed by the sidewall well connection layer 12 and the trench-bottom-surface field-reducing region 13, to form a super-junction structure enables the drift layer 3 to have a high impurity concentration, and reduces ON-resistance.

In other words, the drift layer 3 of n-type provides a depletion layer extending from a pn junction surface between the p-type pillar layer and the n-type pillar layer, in addition to a depletion layer extending from a pn junction surface or metal junction surface located on a surface of the trench-gate MOSFET 500. In short, the drift layer 3 has a depletion layer formed as deep as the pillar layers. Consequently, even if the impurity concentration of the n-type pillar layer, that is, the impurity concentration of the drift layer 3, is set to be high, it is brought into balance with the impurity concentration of the p-type pillar layer, thus rendering the n-type pillar layer completely depleted to maintain breakdown voltage. The trade-off relationship between the breakdown voltage and ON-resistance of the trench-gate MOSFET 500 consequently improves dramatically to reduce drift resistance. This reduces the ON-resistance.

Other Applicable Examples

Figure 36:
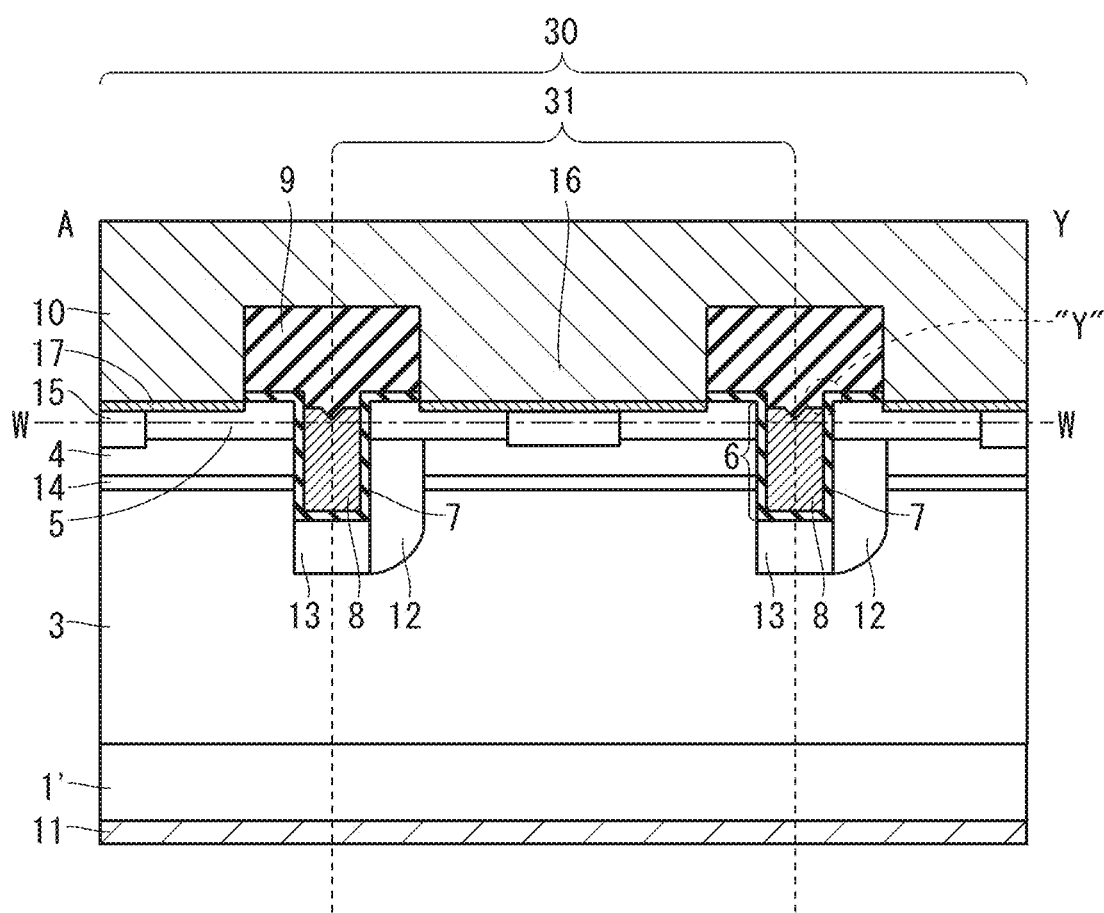
FIG. 36 is a cross-sectional diagram of an IGBT according to one or more embodiments of the present invention.

The first to fifth embodiments of the present invention have described, by way of example, that the present invention is applied to a MOSFET. The present invention is also applicable to any other thing. For instance, the present invention is applicable to an IGBT obtained by removing the silicon-carbide semiconductor substrate 1, and instead, injecting p-type impurities into the back surface of the drift layer 3 to form a p-type impurity layer 1' (i.e., third semiconductor layer) as shown in FIG. 36. Alternatively, the present invention is applicable to an IGBT obtained by using a p-type substrate as the silicon-carbide semiconductor substrate 1. Such IGBTs achieve effects similar to those achieved by a MOSFET. In this case, the source region 5 corresponds to an emitter region of the IGBT, and the drain electrode 11 corresponds to a collector electrode of the IGBT.

Although the first to fifth embodiments have described a semiconductor device made of silicon carbide, a semiconductor material other than silicon carbide may be used. Examples of such a semiconductor material include silicon (Si) and a wide bandgap material other than silicon carbide.

Examples of the wide bandgap material other than silicon carbide include $Ga_2O_3$, gallium nitride (GaN), and diamond.

A semiconductor device made of wide bandgap material, such as silicon carbide, is promising as a high-temperature high-voltage semiconductor device. Since the reliability of an insulating film degrades under high temperature, applying the above embodiments brings a great effect. In addition, since the improvement of breakdown voltage increases voltage applied across the insulating film, applying the above embodiments brings a great effect.

It is known that a silicon-carbide semiconductor device has more electron traps, generated at a MOS interface between the gate insulating film 7 and the drift layer 3 (i.e., silicon carbide layer), than a silicon semiconductor device. In such a silicon-carbide semiconductor device, the reliability of the MOS interface and gate insulating film 7 is lower than that in a silicon semiconductor device. For this reason, applying the above embodiments, which successfully reduce an electric field applied across the gate insulating film 7, brings a great effect.

Sixth Embodiment

A sixth embodiment describes a power converter that includes the semiconductor device according to one of the first to fifth embodiments. The semiconductor device according to one of the first to fifth embodiments is included not only in a particular power converter, but also in any power converter. The sixth embodiment describes an instance where the semiconductor device is included in a three-phase inverter.

Figure 35:
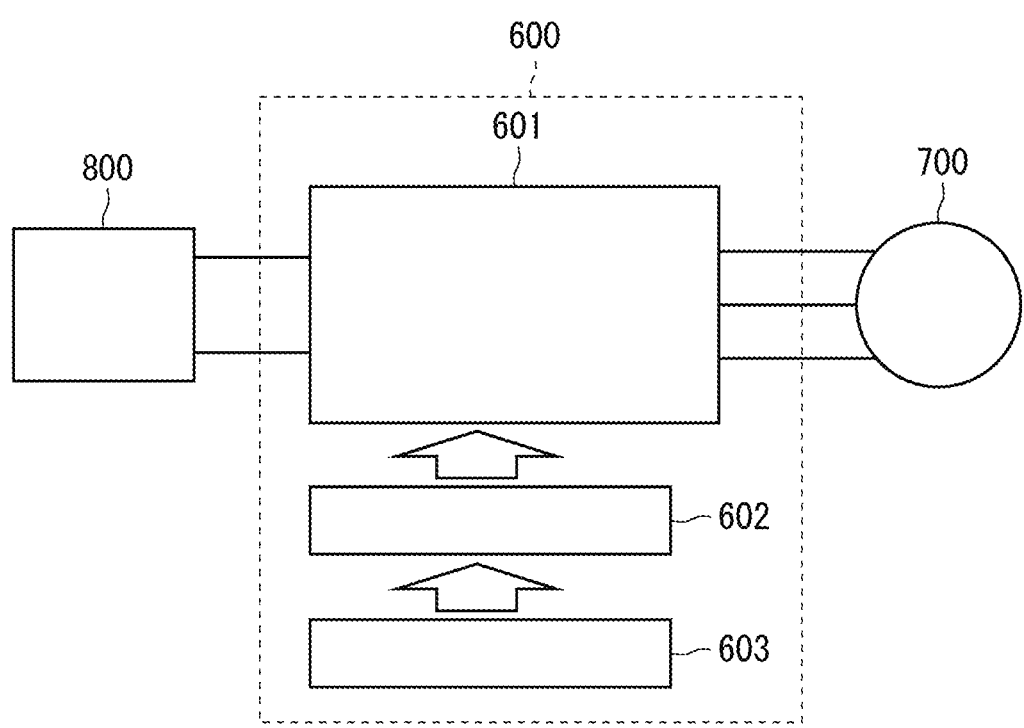
FIG. 35 is a block diagram showing the configuration of a power conversion system according to a sixth embodiment of the present invention.

FIG. 35 is a block diagram showing the configuration of a power conversion system that includes the power converter according to the sixth embodiment of the present invention.

The power conversion system in FIG. 35 includes a power supply 800, a power converter 600, and a load 700. The power supply 800 is a DC power supply and supplies DC power to the power converter 600. The power supply 800 can be formed of various things (e.g., a DC system, a photovoltaic cell, or a storage battery), and may be formed of a rectifier circuit or AC-to-DC converter connected to an AC system. Alternatively, the power supply 800 may be formed of a DC-to-DC converter that converts DC power emitted from a DC system, into a predetermined level of power.

The power converter 600 is a three-phase inverter connected between the power supply 800 and the load 700, and converts the DC power supplied from the power supply 800, into AC power and supplies the AC power to the load 700. The power converter 600 includes the following circuits: a main conversion circuit 601 that converts DC power into AC power to output the AC power; a drive circuit 602 that outputs a drive signal for driving each switching element of the main conversion circuit 601; and a control circuit 603 that outputs a control signal for controlling the drive circuit 602, to the drive circuit 602.

The load 700 is a three-phase motor driven by the AC power supplied from the power converter 600. It is noted that the load 700 is not limited to a particular use; the load 700 is a motor mounted on various electric apparatuses, and is used as a motor intended for use in, for instance, a hybrid vehicle, electric vehicle, railway vehicle, elevator, or air conditioning device.

The following details the power converter 600. The main conversion circuit 601 includes switching elements and freewheeling diodes (not shown). The switching elements switch to covert the DC power supplied from the power supply 800, into AC power and output the AC power to the load 700. Although the specific configuration of the main conversion circuit 601 can take various forms, the main conversion circuit 601 according to the sixth embodiment is a two-level three-phase full-bridge circuit, which can be formed of six switching elements and six freewheeling diodes connected in reverse parallel to the respective switching elements. The semiconductor device according to any one of the first to fifth embodiments is used as each switching element of the main conversion circuit 601. The six switching elements are configured such that each pair of two switching elements connected in series forms a set of upper and lower arms, and that the sets of upper and lower arms form respective phases (i.e., U-, V-, and W-phases) of the full-bridge circuit. In addition, output terminals of the individual sets of upper and lower arms, that is, three output terminals of the main conversion circuit 601, are connected to the load 700.

The drive circuit 602 generates a drive signal for driving the switching elements of the main conversion circuit 601, and supplies the drive signal to control electrodes of the switching elements of the main conversion circuit 601. To be specific, in response to a control signal from the control circuit 603, which will be described later on, the drive circuit 602 outputs a drive signal for turning on the switching elements and a drive signal for turning off the switching elements, to the control electrodes of the individual switching elements. For keeping the switching elements ON, the drive signal is a voltage signal greater than or equal to a threshold voltage (this drive signal is call an ON signal). For keeping the switching elements OFF, the drive signal is a voltage signal less than to a threshold voltage (this drive signal is called an OFF signal).

The control circuit 603 controls the switching elements of the main conversion circuit 601 so that a desired level of power is supplied to the load 700. To be specific, based on a power level to be supplied to the load 700, the control circuit 603 calculates a time during which each switching element of the main conversion circuit 601 should be in ON state. For instance, the control circuit 603 can control the main conversion circuit 601 through PWM control, which is a method of modulating the ON-time of the switching elements in accordance with a voltage that should be output. The control circuit 603 then outputs a control instruction (i.e., control signal) to the drive circuit 602 so that an ON-signal is output to the switching elements that should be turned on at each time point, and that an OFF-signal is output to the switching elements that should be turned off at each time point. In response to the control signal, the drive circuit 602 outputs, as a drive signal, the ON-signal or OFF signal to the control electrode of each switching element.

The power converter according to the sixth embodiment includes the semiconductor device according to any one of the first to fifth embodiments as the switching elements of the main conversion circuit 601. The power converter thus successfully reduces electric fields that are applied to the bottom surfaces of gate trenches when the switching elements are in OFF state. In addition, the trench-bottom-surface field-reducing region 13 and the well region 4 are electrically connected to each other by the sidewall well connection layer 12. This allocates a current path for charge and discharge at a pn junction formed by the trench-bottom-surface field-reducing region 13 and drift layer 3. Switching loss is consequently reduced.

Although the sixth embodiment has described a two-level three-phase inverter by way of example, the sixth embodiment is applicable to various power converters. Although the sixth embodiment has described two-level power converter, the sixth embodiment may be applied to a three-level power converter or multi-level power converter. Alternatively, for supplying power to a single-phase load, the sixth embodiment may be applied to a single-phase inverter. Furthermore, for supplying power to a DC load or other things, the sixth embodiment is applicable to a DC-to-DC converter or AC-to-DC converter.

The aforementioned load is not limited to a motor and can be used as a power supply unit of an electric discharge machine, laser beam machine, induction-heating cooking utensil or contactless power-supply system. The aforementioned load can further be used as a power conditioner of a photovoltaic power system, storage battery system, or other systems.

CONCLUSION

In some cases, the aforementioned embodiments describe the material quality, material, size, and shape of each component, the relative relationship in arrangement between the components, conditions for implementation, and other things. They are illustrative in all aspects and are thus not limited to what are described in the Description. Accordingly, numerous variations and equivalents that are not illustrated herein can be devised within the scope of the embodiments. For instance, any component can undergo modification, addition, or omission. Furthermore, at least one component can be extracted from at least one embodiment to be combined with a component in another embodiment.

Unless otherwise contradicted, the components described in the aforementioned embodiments in such a manner that "one component" is provided, may be formed of "one or more" components. Furthermore, the individual components are conceptual units. Thus, in some cases, one component is formed of multiple structures. In other cases, one component corresponds to part of a certain structure having one component.

It is not an admission that any of the descriptions provided herein are conventional arts.

The individual embodiments can be freely combined with each other, and can be modified and omitted as appropriate.

The invention claimed is:

1. A semiconductor device comprising:
a first semiconductor layer of a first conductivity type;
a first semiconductor region of the first conductivity type selectively disposed in an upper layer of the first semiconductor layer;
a second semiconductor region of a second conductivity type disposed in the upper layer of the first semiconductor layer so as to be in contact with the first semiconductor region;
a third semiconductor region of the second conductivity type disposed on bottom surfaces of the first and second semiconductor regions;
a plurality of gate trenches provided to penetrate the first and third semiconductor regions in a thickness direction of the first and third semiconductor regions, the plurality of gate trenches each comprising a bottom surface reaching an inside of the first semiconductor layer, the plurality of gate trenches being in a form of stripes and extending only in one direction in a plan view;
a field-reducing region of the second conductivity type disposed on the bottom surface of each of the plurality of gate trenches;
an interlayer insulating film comprising contact openings above the first and second semiconductor regions;
a plurality of connection layers arranged in the first semiconductor layer at intervals so as to be each in contact with at least one of sidewalls of a corresponding one of the plurality of gate trenches in a second direction perpendicular to a first direction parallel with a direction in which the plurality of gate trenches extend, the intervals between the plurality of connection layers adjacent to each other in the first direction being set to be as large as or larger than an interval at which the plurality of gate trenches are arranged, the plurality of connection layers each electrically connecting the field-reducing region to the third semiconductor region;
a first main electrode disposed over the interlayer insulating film and filled in the contact openings; and
a second main electrode disposed on a main surface of the first semiconductor layer, the main surface being opposite from where the first main electrode is disposed,
wherein the first semiconductor layer has an off-angle greater than 0 degrees,
the first direction is parallel with an off-direction, and
the plurality of connection layers are spaced from each other in the first direction.

2. The semiconductor device according to claim 1, wherein
the first semiconductor layer comprises a silicon-carbide layer,
the first semiconductor layer has an off-angle greater than 0 degrees in a <11-20> direction, and
the plurality of gate trenches each comprise a sidewall surface comprising a (1-100) plane or (−1100) plane.

3. The semiconductor device according to claim 1, wherein
each of the plurality of connection layers is provided to extend in the second direction from the sidewall of the corresponding one of the plurality of gate trenches, and
the plurality of connection layers are shorter in the second direction than a length between the plurality of gate trenches adjacent to each other.

4. The semiconductor device according to claim 1, wherein
the plurality of connection layer each comprise
a first connection layer provided to be in contact with the corresponding one of the plurality of gate trenches, and
a second connection layer located to be farther from the corresponding one of the plurality of gate trenches than the first connection layer, and
the first connection layer has an impurity concentration higher than an impurity concentration of the second connection layer.

5. The semiconductor device according to claim 1, wherein the plurality of connection layers each have an impurity concentration of $1\times10^{17}$ cm$^{-3}$ or more and $5\times10^{19}$ cm$^{-3}$ or less.

6. The semiconductor device according to claim 1, wherein the plurality of connection layers each have a length of 0.3 μm or more in a thickness direction of the first semiconductor layer.

7. The semiconductor device according to claim 1, wherein
the plurality of connection layers each comprise
a first connection layer provided to be in contact with the corresponding one of the plurality of gate trenches, and
a second connection layer located to be farther from the corresponding one of the plurality of gate trenches than the first connection layer, and
the first and second connection layers are of the second conductivity type.

8. The semiconductor device according to claim 1, wherein
the plurality of connection layers each comprise
a first connection layer provided to be in contact with the corresponding one of the plurality of gate trenches, and
a second connection layer located to be farther from the corresponding one of the plurality of gate trenches than the first connection layer,
the first connection layer is of the first conductivity type, and
the second connection layer is of the second conductivity type.

9. The semiconductor device according to claim 1, wherein each of the plurality of connection layers is provided to have such a length in a thickness direction of the first semiconductor layer as to decrease along with distance in the second direction from the sidewall of the corresponding one of the plurality of gate trenches.

10. The semiconductor device according to claim 1, wherein the plurality of connection layers are disposed on only one of the sidewalls of the corresponding one of the plurality of gate trenches in the second direction.

11. The semiconductor device according to claim 1, wherein the plurality of connection layers are provided alternately on one of the sidewalls and the other sidewall of the corresponding one of the plurality of gate trenches in the second direction.

12. The semiconductor device according to claim 1, wherein the plurality of connection layers are provided to be in contact with the third semiconductor region and the second semiconductor region.

13. The semiconductor device according to claim 1, further comprising
a current spreading region of the first conductivity type disposed in the first semiconductor layer, the current spreading region being in contact with each of the plurality of connection layers and the field-reducing region,
wherein the current spreading region is provided to have an impurity concentration higher than that of the first semiconductor layer.

14. The semiconductor device according to claim 1, further comprising a second semiconductor layer of the first conductivity type disposed on a bottom surface of the third semiconductor region.

15. The semiconductor device according to claim 1, wherein
the plurality of gate trenches comprise
a first gate trench comprising an inner-wall surface covered with a gate insulating film, the first gate trench being filled with a gate electrode, and
a second gate trench comprising an inner-wall surface covered with a Schottky electrode, the second gate trench being filled with the first main electrode, and
the first gate trench comprises an upper portion covered with the interlayer insulating film.

16. The semiconductor device according to claim 1, wherein
the plurality of connection layers are of the second conductivity type,
each of the plurality of connection layers and the field-reducing region form a pillar of the second conductivity type,
the first semiconductor layer between the pillars of the second conductivity type adjacent to each other forms a pillar of the first conductivity type, and
the pillar of the first conductivity type and the pillar of the second conductivity type form a super-junction structure.

17. The semiconductor device according to claim 1, further comprising a third semiconductor layer of the second conductivity type disposed between the second main electrode and the first semiconductor layer.

18. The semiconductor device according to claim 1, wherein the contact openings are uniform in length in at least the second direction, in an active region where the plurality of gate trenches are arranged.

19. A power converter comprising:
a main conversion circuit comprising the semiconductor device according to claim 1, the main conversion circuit being configured to convert and then output received power;
a drive circuit configured to output a drive signal for driving the semiconductor device, to the semiconductor device; and
a control circuit configured to output a control signal for controlling the drive circuit, to the drive circuit.

* * * * *